US007198876B2

(12) United States Patent
Inno

(10) Patent No.: US 7,198,876 B2
(45) Date of Patent: Apr. 3, 2007

(54) METHOD OF PREPARATION OF LITHOGRAPHIC PRINTING PLATES

(75) Inventor: Toshifumi Inno, Shizuoka (JP)

(73) Assignee: Fuji Photo Film Co., Ltd., Kanagawa-ken (JP)

(*) Notice: Subject to any disclaimer, the term of this patent is extended or adjusted under 35 U.S.C. 154(b) by 0 days.

(21) Appl. No.: 10/420,857

(22) Filed: Apr. 23, 2003

(65) Prior Publication Data

US 2003/0215750 A1 Nov. 20, 2003

(30) Foreign Application Priority Data

Apr. 24, 2002 (JP) .......................... P.2002-122295
Apr. 24, 2002 (JP) .......................... P.2002-122654

(51) Int. Cl.
*G03F 7/26* (2006.01)

(52) U.S. Cl. .................. 430/138; 430/194; 430/270.1; 430/271.1; 430/273.1; 430/302; 430/309; 430/401; 430/434; 430/435; 430/448; 430/944; 430/945; 101/463.1

(58) Field of Classification Search ................ 430/138, 430/270.1, 271.1, 273.1, 302, 309, 401, 434, 430/435, 448, 194, 944, 945
See application file for complete search history.

(56) References Cited

U.S. PATENT DOCUMENTS 6,001,536 A * 12/1999 Vermeersch et al. ........ 430/302
6,042,987 A * 3/2000 Kobayashi ............... 430/270.1
6,238,837 B1 * 5/2001 Fan ......................... 430/273.1
6,284,433 B1 * 9/2001 Ichikawa et al. ........... 430/303
6,547,461 B1 * 4/2003 Matsuda et al. ............ 396/614
6,632,580 B2 * 10/2003 Maemoto .................... 430/138
6,641,976 B2 * 11/2003 Vermeersch et al. ..... 430/270.1
6,699,636 B2 * 3/2004 Savariar-Hauck ........ 430/270.1
6,740,464 B2 * 5/2004 Maemoto .................... 430/138
2002/0182538 A1 * 12/2002 Tomita et al. ........... 430/278.1
2003/0170570 A1 * 9/2003 Vander Aa et al. ......... 430/302

FOREIGN PATENT DOCUMENTS

| | | | |
|---|---|---|---|
| EP | 0 514 145 | A1 | 5/1992 |
| EP | 0 646 476 | A1 | 4/1995 |
| EP | 0 773 113 | A1 | 5/1997 |
| EP | 1 061 418 | A2 | 12/2000 |
| EP | 1 145 848 | A2 | 10/2001 |
| EP | 1 145 848 | A3 | 10/2001 |
| EP | 1 147 886 | A2 * | 10/2001 |
| JP | 9-127683 | A | 5/1997 |
| JP | 2938397 | B2 | 6/1999 |
| WO | WO/99/10186 | A1 | 4/1999 |

* cited by examiner

*Primary Examiner*—Barbara L. Gilliam
(74) *Attorney, Agent, or Firm*—Sughrue Mion, PLLC

(57) ABSTRACT

A method for preparation of a lithographic printing plate, which comprises the steps of: imagewise recording on a lithographic printing plate precursor comprising a support having a hydrophilic surface and a thermosensitive layer, the thermosensitive layer comprising at least one of polymer particles and a microcapsule encapsulating an oleophilic compound therein; and rubbing the printing plate precursor by a rubbing member in the presence of a processing liquid to remove the thermosensitive layer of non-image portions.

23 Claims, 1 Drawing Sheet

METHOD OF PREPARATION OF LITHOGRAPHIC PRINTING PLATES

FIELD OF THE INVENTION

The present invention relates to a method of preparation of lithographic printing plates from direct thermosensitive lithographic printing plate precursors. More specifically, the invention relates to s simple development processing method for preparation of lithographic printing plates from thermosensitive lithographic printing plate precursors capable of undergoing imagewise recording by scanning exposure based on digital signals.

BACKGROUND OF THE INVENTION

In general, lithographic printing plates are comprised of oleophilic image portions receiving inks during the printing step and hydrophilic non-image portions receiving dampening water. As such lithographic printing plates, PS plates comprising an oleophilic light-sensitive resin layer provided on a hydrophilic support have hitherto been widely used. In the conventional process works of PS plates, after the exposure, an operation of dissolution and removal of the non-image portions with a highly alkaline development processing liquid is needed. In the conventional techniques, one of problems that should be improved was to make such an additional wet processing simple or unnecessary. Especially, in recent years, disposal of wastes to be discharged following the wet processing is being a great matter of concern over the whole of the industrial field from consideration to the global environment, and therefore, a demand of improvement in this issue becomes strong more and more.

On the other hand, in recent years, as another trend of this field, digitization techniques of electronic processing, accumulation and outputting of image information using a computer become widespread, and various new image-outputting modes responsible to such digitization techniques have been put into practical use. Following this, computer-to-plate techniques of carrying the digitized image information on a highly convergent radiation such as laser, scanning exposing a printing precursor with this light, and directly manufacturing a printing plate without using a lith film are watched.

Especially, in recent years, high-output solid lasers such as semi-conductor laser and YAG laser have become available cheaply. Accordingly, the printing plate preparation work with high power-density exposure using a high-output laser has become promising. According to this preparation work, the exposed region is convergently irradiated with a large dose of light energy during an instantaneous exposure time, to efficiently convert the light energy into a heat energy, and the heat causes chemical change, phase change, and heat changes such as change of shape or structure, thereby utilizing such changes for imagewise recording. That is, while the image information is input by the light energy such as laser, the imagewise recording is achieved by the reaction by the heat energy.

Usually, the recording mode utilizing heat generation by high powder-density exposure is called heat mode recording, and conversion of the light energy to the heat energy is called light-heat conversion.

Of these heat mode-recording lithographic printing plate precursors, thermosensitive lithographic printing plate precursors comprising, as an image forming thermosensitive layer, a hydrophilic layer having hydrophobic thermoplastic polymer particles dispersed in a hydrophilic binder polymer are promising for simple development processing. A method of using such a thermosensitive lithographic printing plate precursor utilizes a phenomenon where when a heat is applied to the thermosensitive layer, the hydrophobic thermoplastic polymer particles are fused to each other, thereby converting the surface of the hydrophilic thermosensitive layer into an oleophilic image portion.

For example, Japanese Patent No. 2,938,397, JP-A-9-127683 and WO99-10186 disclose lithographic printing plate precursors comprising a hydrophilic support having provided thereon a thermosensitive layer having fine particles of a thermoplastic hydrophobic polymer dispersed in a hydrophilic binder polymer. These patent documents describe that in such lithographic printing plate precursors, the fine particles of the thermoplastic hydrophobic polymers are united with each other by heat upon exposure with infrared laser to form an image, which is then developed in a printing machine while supplying dampening water and/or an ink (so-called "development-on-printing machine").

However, it is difficult to thoroughly remove the thermosensitive layer of non-image portions containing such thermoplastic hydrophobic fine particles by the development-on-printing machine by dampening water or an oily ink, so that there was involved a problem that the thermosensitive layer components remain in the non-image portions to cause staining in printing.

SUMMARY OF THE INVENTION

Accordingly, an object of the invention is to provide a method of preparation of lithographic printing plates from lithographic printing plate precursors capable of undergoing heat mode recording and simple development processing.

A further object of the invention is to a simple development processing method capable of efficiently and surely removing a thermosensitive layer of non-image portions of a lithographic printing plate precursor provided with the thermosensitive layer containing a finely granular polymer (polymer particles).

A further object of the invention is to a simple development processing method capable of efficiently and surely removing a thermosensitive layer of non-image portions of a lithographic printing plate precursor provided with the thermosensitive layer containing a microcapsule encapsulating an oleophilic compound, and preferably a thermoreactive functional group-containing compound therein.

In order to achieve the foregoing objects, the present inventors made extensive and intensive investigations. As a result, it has been found that it is possible to efficiently and surely remove the finely granular polymer-containing thermosensitive layer provided on a support by rubbing a printing plate by a rubbing member in the presence of a processing liquid by an automatic processor provided with the rubbing member, leading to accomplishment of the invention.

Specifically, a first aspect of the invention is as follows.

(1) A method of preparation of lithographic printing plates, which comprises the steps of imagewise recording a lithographic printing plate precursor comprising a finely granular polymer-containing thermosensitive layer provided on a support having a hydrophilic surface and rubbing the printing plate by a rubbing member in the presence of a processing liquid by an automatic processor provided with the rubbing member to remove the thermosensitive layer of non-image portions.

Further, preferred embodiments of the first aspect of the invention will be hereunder described.

(2) The method of preparation of lithographic printing plates as set forth in (1) above, wherein a lithographic printing plate precursor having an overcoat layer capable of being removed with the processing liquid provided on the thermosensitive layer is used.

In the lithographic printing plate precursor that is used in the invention, at least a finely granular polymer is contained in a thermosensitive layer on a hydrophilic support; in image recording portions of the thermosensitive layer, upon imagewise heating or by a heat generated by light-heat conversion of laser scanning based on digital signals of a computer, etc., the finely granular polymer, preferably a finely granular polymer having a thermo-reactive functional group, reacts, or melting and fusion occur among the particles of the finely granular polymer; and in the case where a hydrophilic resin is contained in the thermosensitive layer, the resin causes crosslinking and is made waterproof, whereby it becomes hydrophobic.

In order to achieve the foregoing objects, the present inventors made extensive and intensive investigations. As a result, it has been found that it is possible to efficiently and surely remove the thermosensitive layer containing a microcapsule encapsulating an oleophilic compound therein, which is provided on a support, by rubbing a printing plate by a rubbing member in the presence of a processing liquid, leading to accomplishment of the invention.

Specifically, a second aspect of the invention is as follows.

(1) A method of preparation of lithographic printing plates, which comprises the steps of imagewise recording a lithographic printing plate precursor comprising a support having a hydrophilic surface and a thermosensitive layer thereon, the thermosensitive layer containing a microcapsule encapsulating an oleophilic compound therein, and rubbing the printing plate by a rubbing member in the presence of a processing liquid to remove the thermosensitive layer of non-image portions.

Further, preferred embodiments of the second aspect of the invention will be hereunder described.

(2) The method of preparation of lithographic printing plates as set forth in (1) above, wherein a lithographic printing plate precursor having an overcoat layer capable of being removed with the processing liquid provided on the thermosensitive layer is used.

(3) The method of preparation of lithographic printing plates as set forth in (1) or (2) above, wherein the removal of the thermosensitive layer of non-image portions of the imagewise recorded lithographic printing plate precursor is carried out by an automatic processor provided with the rubbing member.

In the lithographic printing plate precursor that is used in the invention, at least a microcapsule encapsulating an oleophilic compound, and preferably a thermo-reactive functional group-containing compound therein is contained in a thermosensitive layer on a hydrophilic support; in image recording portions of the thermosensitive layer, upon imagewise heating or by a heat generated by light-heat conversion of laser scanning based on digital signals of a computer, etc., the thermo-reactive functional group-containing compound or radical polymerizable compound encapsulated in the microcapsule reacts, or melting and fusion occur among the particles of the microcapsule; and in the case where a hydrophilic resin is contained in the thermosensitive layer, the resin causes crosslinking and is made waterproof, whereby it becomes hydrophobic.

According to the preparation method of lithographic printing plates of the invention, it is possible to efficiently and surely remove the thermosensitive layer of non-image portions by rubbing a printing plate of the lithographic printing plate precursor after the heat mode imagewise recording by a rubbing member in the presence of a processing liquid. Thus, especially, it is possible to obtain superior lithographic printing plates that can be prevented from staining during printing out copies by a simple development processing method.

Figure 1:
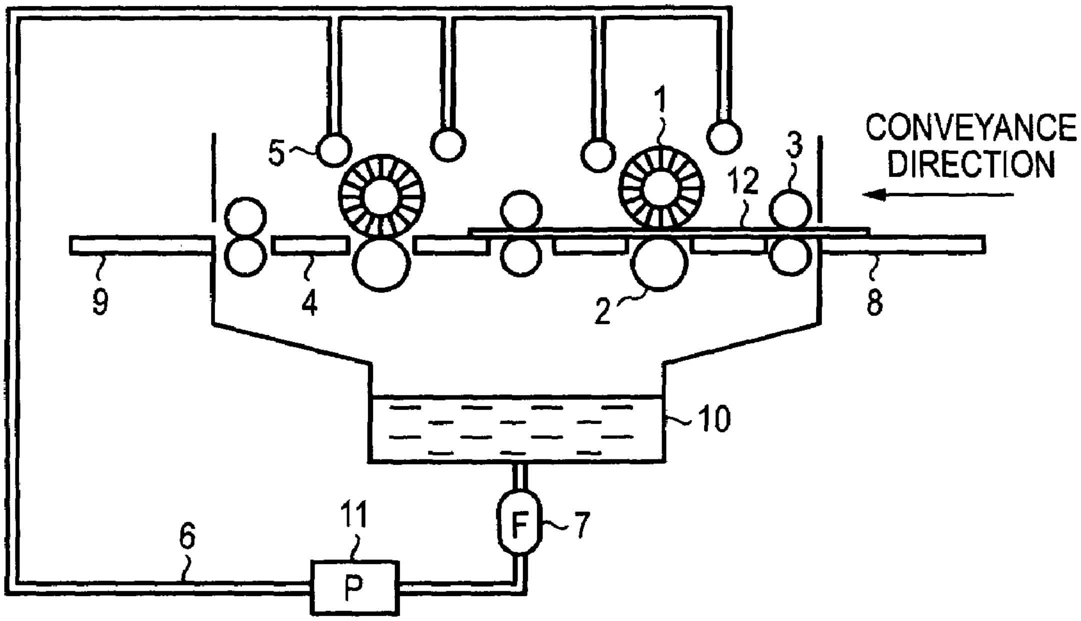
[FIG. 1]

An alignment diagram showing the configuration of an automatic processor suitable for an automatic processing of the invention.

DESCRIPTION OF REFERENCE NUMERALS AND SIGNS

1: Rotary brush roll
2: Receiving roll
3: Conveying roll
4: Conveyance guide board
5: Spray pipe
6: Conduit
7: Filter
8: Plate-supply table
9: Plate-discharge table
10: Processing liquid (tank)
11: Circulating pump
12: Lithographic printing plate precursor

DETAILED DESCRIPTION OF THE INVENTION

The preparation method of lithographic printing plates according to the invention will be hereunder described in detail.

The lithographic printing plate precursor that is applied in the preparation method of lithographic printing plates according to the first aspect of the invention is characterized by having a finely granular polymer-containing thermosensitive layer on a support having a hydrophilic surface.

As described above, the thermosensitive layer of the lithographic printing plate precursor that is used in the first aspect of the invention contains a finely granular polymer. However, as described later, in addition to the finely granular polymer, preferably a finely granular polymer having a thermo-reactive functional group, it may further optionally contain a compound to initiate or promote the reaction, a hydrophilic resin, a light-heat converting agent, etc. and may additionally contain other constitutional components.

The lithographic printing plate precursor that is applied in the preparation method of lithographic printing plates according to the second aspect of the invention is characterized by having a thermosensitive layer containing a microcapsule encapsulating an oleophilic compound, and preferably a thermo-reactive functional group-containing compound therein, on a support having a hydrophilic surface.

As described above, the thermosensitive layer of the lithographic printing plate precursor that is used in the second aspect of the invention preferably contains a microcapsule encapsulating an oleophilic compound therein. However, as described later, in addition to the microcapsule, it may further optionally contain a compound to initiate or promote the reaction, a hydrophilic resin, a light-heat converting agent, etc. and may additionally contain other constitutional components.

In the invention, the preparation method of lithographic printing plates is characterized by including a step in which after imagewise recording of the lithographic printing plate precursor, the printing plate is rubbed by a rubbing member in the presence of a processing liquid to remove the thermosensitive layer of non-image portions.

In the invention, it is possible to suitably carry out the removal of the thermosensitive layer of non-image portions by an automatic processor provided with supply means of the processing liquid and a rubbing member. The automatic processor is not particularly limited, but an automatic processor using a rotary brush roll as the rubbing member is particularly preferable.

FIG. 1 shows an alignment diagram of an automatic processor suitable for the automatic processing of the invention. That is, the lithographic printing plate is prepared by a step of removing the thermosensitive layer of non-image portions by the automatic processor in which a processing liquid 10 is conveyed into a spray pipe 5 by a circulating pump 11 and supplied to a rotary brush roll 1 and a printing plate 12 (lithographic printing plate precursor) while showering, thereby rubbing the printing plate 12 by the rotary brush roll 1.

Each of the constructions of the lithographic printing plate precursor to which the preparation method of lithographic printing plates according to the invention is applied will be hereunder described.

(Support Having a Hydrophilic Surface)

The support having a hydrophilic surface to be used in the invention includes one in which the support itself is hydrophilic, one in which the surface of the support is hydrophilized, and one having a hydrophilic surface provided thereon.

The support that is used in the lithographic printing plate precursor of the invention is a dimensionally stable plate-like material. Examples include papers, papers laminated with plastics (such as polyethylene, polypropylene, and polystyrene), metallic plates (such as aluminum, zinc, and copper), plastic films (such as cellulose diacetate, cellulose triacetate, cellulose propionate, cellulose butyrate, cellulose acetate butyrate, cellulose nitrate, polyethylene terephthalate, polyethylene naphthalate, polyethylene, polystyrene, polypropylene, polycarbonates, and polyvinyl acetal), the foregoing plastic films having a pigment dispersed therein, the foregoing plastic films having voids, and papers or plastic films laminated or vapor deposited with each of the foregoing metals.

As the support that is used in the lithographic printing plate precursor of the invention, are preferable polyester films and aluminum plates.

Among them are particularly preferable aluminum plates that are good in dimensional stability and relatively cheap. Preferred examples of the aluminum plates include pure aluminum plates and alloy plates containing aluminum as a major component and trace amounts of foreign elements. Further, plastic films laminated or vapor deposited with aluminum are useful. Examples of the foreign elements to be contained in the aluminum alloys include silicon, iron, manganese, copper, magnesium, chromium, zinc, bismuth, nickel, and titanium. The content of these foreign elements in the alloy is 10% by weight at the most.

In the invention, the particularly preferable aluminum is pure aluminum. However, since the manufacture of completely pure aluminum is difficult in the smelting technology, trace amounts of foreign elements may be contained. The aluminum plate that is applied in the invention is not specified in terms of composition, but aluminum plates composed of the conventionally known and employed materials can be properly utilized. The aluminum plate to be used in the invention has a thickness of from about 0.1 mm to 0.6 mm, preferably from 0.15 mm to 0.4 mm, and especially preferably from 0.2 mm to 0.3 mm.

Prior to roughing the aluminum plate, if desired, degreasing processing with, for example, a surfactant, an organic solvent, or an alkaline aqueous solution is carried out for the purpose of removing a rolling oil on the surface.

The roughing processing of the surface of the aluminum plate can be carried out by various methods. Examples include a method of mechanically roughing the surface, a method of electrochemically dissolving and roughing the surface, and a method of chemically selectively dissolving the surface. As the mechanical roughing method, known methods such as ball polishing method, brush polishing method, blast polishing method, and buff polishing method can be employed. Further, as the electrochemical roughing method, a method of using an alternate current or direct current in a hydrochloric acid or nitric acid electrolyte solution can be employed. Moreover, a combined method of the both as disclosed in JP-A-54-63902 can also be utilized.

Preferably, the roughing processing according to the foregoing methods is carried out such that a centerline surface roughness (Ha) of the surface of the aluminum plate falls within the range of from 0.3 to 1.0 μm.

If desired, the roughed aluminum plate is subjected to alkaline etching processing using an aqueous solution of, for example, potassium hydroxide or sodium hydroxide. If further desired, after neutralization processing, the resulting aluminum plate is subjected to anodic oxidation processing for the purpose of enhancing the abrasion resistance.

As the electrolyte that is used in the anodic oxidation processing of the aluminum plate, various electrolytes for forming a porous oxidized film can be used, and sulfuric acid, hydrochloric acid, oxalic acid, chromic acid, or a mixed acid thereof is generally used. The concentration of such an electrolyte is properly determined by the kind of the electrolyte.

Since the processing condition of the anodic oxidation varies depending on the electrolyte to be used, it cannot be unequivocally defined. However, in general, the concentration of the electrolyte is in the range of from 1 to 80% by weight in the solution; the liquid temperature is in the range of from 5 to 70° C.; the current density is in the range of from 5 to 60 A/$dm^2$; the voltage is in the range of from 1 to 100 V; and the electrolysis time is in the range of from 10 seconds to 5 minutes.

The amount of the anodically oxidized film is from 1.0 to 5.0 g/$m^2$, and especially from 1.5 to 4.0 g/$m^2$.

When the amount of the anodically oxidized film is less than 1.0 g/$m^2$, the printability is not satisfactory, or the non-image portions of the lithographic printing plate are liable to flaw, whereby the ink is adhered to the flaws during printing, a phenomenon of which is so-called "flaw stain".

After the anodic oxidation processing, if desired, the aluminum surface is subjected to hydrophilization processing. As the hydrophilization processing, the alkali metal silicate method (for example, a method of using a sodium silicate aqueous solution) as disclosed in U.S. Pat. Nos. 2,714,066, 3,181,461, 3,280,734 and 3,902,734 can be employed. In this method, the support is subjected to dipping processing or electrolysis processing with a sodium silicate aqueous solution. Besides, there are a method of processing with potassium fluorozirconate as disclosed in JP-B-36-22063 and a method of processing with polyvinyl sulfonate as disclosed in U.S. Pat. Nos. 3,276,868, 4,153, 461 and 4,689,272.

Further, in the case where a non-conductive material such as polyester films is used as the support of the invention, it is preferred to provide an antistatic layer in the side of the thermosensitive layer of the support or the opposite side thereto, or in the both sides.

In the case where the antistatic layer is provided between the support and a hydrophilic layer as described later, the antistatic layer also contributes to an enhancement of the adhesion of the hydrophilic layer.

As the antistatic layer, can be used polymer layers having metallic oxide fine particles or a matting agent dispersed therein.

Examples of the materials of the metallic oxide particles that are used in the antistatic layer include $SiO_2$, ZnO, $TiO_2$, $SnO_2$, $Al_2O_3$, $In_2O_3$, MgO, BaO, $MoO_3$, $V_2O_5$, and composite oxides thereof, and/or these metallic oxides further containing a foreign atom. These metallic oxides may be used singly or in admixture.

Among these metallic oxides are preferable $SiO_2$, ZnO, $SnO_2$, $Al_2O_3$, $TiO_2$, $In_2O_3$, and MgO.

Examples of the metallic oxides containing a small amount of a foreign atom include ZnO doped with Al or In, $SnO_2$ doped with Sb, Nb or a halogen element, and $In_2O_3$ doped with a foreign atom such as Sn, in which the doping amount of the foreign atom is 30 mole % or less, and preferably 10 mole % or less.

Preferably, the metallic oxide particles are contained in an amount ranging from 10 to 90% by weight in the antistatic layer.

The particle size of the metallic oxide particles is preferably in the range of from 0.001 to 0.5 μm in terms of mean particle size. The "mean particle size" as referred to herein means a value including not only a primary particle size of the metallic oxide particles but also a particle size of secondary or higher-order structures.

Examples of the matting agent that can be used in the antistatic layer include inorganic or organic particles preferably having a mean particle size of from 0.5 to 20 μm, and more preferably from 1.0 to 15 μm.

Examples of the inorganic particles include metallic oxides such as silicon oxide, aluminum oxide, titanium oxide, and zinc oxide; and metal salts such as calcium carbonate, barium sulfate, barium titanate, and strontium titanate. Examples of the organic particles include crosslinked particles of polymethyl methacrylate, polystyrene, polyolefins, and copolymers thereof.

Preferably, the matting agent is contained in an amount ranging from 1 to 30% by weight in the antistatic layer.

Examples of the polymer that can be used in the antistatic layer include proteins such as gelatin and casein; cellulose compounds such as carboxymethyl cellulose, hydroxyethyl cellulose, acetyl cellulose, diacetyl cellulose, and triacetyl cellulose; sugars such as dextran, agar-agar, sodium alginate, and starch derivatives; and synthetic polymers such as polyvinyl alcohol, polyvinyl acetate, polyacrylic esters, polymethacrylic esters, polystyrene, polyacrylamide, polyvinylpyrrolidone, polyesters, polyvinyl chloride, polyacrylic acid, and polymethacrylic acid.

Preferably, the polymer is contained in an amount ranging from 10 to 90% by weight in the antistatic layer.

Preferably, the antistatic layer has a thickness of from 0.01 to 1 μm.

For the purpose of making the surface of the support hydrophilic, examples of the hydrophilic layer that can be provided on the support of the invention include layers containing an organic hydrophilic matrix obtained by crosslinking or pseudo-crosslinking an organic hydrophilic polymer or an inorganic hydrophilic matrix obtained by sol-gel conversion comprising hydrolysis and condensation reaction of a polyalkoxysilane, titanate, zirconate or aluminate, and inorganic thin films having a surface containing a metallic oxide. Among them are preferable inorganic thin films having an inorganic hydrophilic matrix obtained by sol-gel conversion or having a surface containing a metallic oxide.

As the crosslinking reaction that is used in the formation of an organic hydrophilic matrix of the hydrophilic layer of the invention, covalent bond formation by heat or light, or ionic bond formation by a polyvalent metal salt can be employed.

As the organic hydrophilic polymer that is used in the invention, are preferable polymers having a functional group that can be used in the crosslinking reaction.

Preferred examples of the functional group include —OH, —SH, $—NH_2$, —NH—, $—CO—NH_2$, —CO—NH—, —O—CO—NH—, —NH—CO—NH—, —CO—OH, —CO—O—, $—CO—O^-$, —CS—OH, —CO—SH, —CS—SH, $—SO_3H$, $—SO_2(O^-)$, $—PO_3H_2$, $—PO(O^-)_2$, $—SO_2—NH_2$, $—SO_2—NH—$, $—CH{=}CH_2$, —CH=CH—, $—CO—C(CH_3){=}CH_2$, $—CO—CH{=}CH_2$, $—CO—CH_2—CO—$, —CO—O—CO—, and the following functional groups.

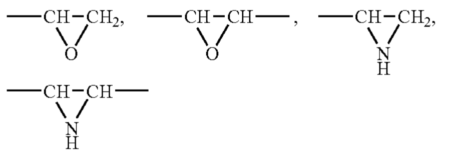

Of these are especially preferable a hydroxyl group, an amino group, a carboxyl group, and an epoxy group.

As the organic hydrophilic polymer of the invention, known water-soluble binders can be used. Examples include polyvinyl alcohols (polyvinyl acetate having a degree of hydrolysis of 60% or more), modified polyvinyl alcohols such as carboxy-modified polyvinyl alcohols, starches and derivatives thereof, carboxymethyl cellulose and salts thereof, cellulose derivatives such as hydroxyethyl cellulose, casein, gelatin, gum arabic, polyvinylpyrrolidone, a vinyl acetate-crotonic acid copolymer and salts thereof, a styrene-maleic acid copolymer and salts thereof, polyacrylic acid and salts thereof, polymethacrylic acid and salts thereof, polyethylene glycol, polyethyleneimine, polyvinylsulfonic acid and salts thereof, polystyrenesulfonic acid and salts thereof, poly(methacryloyloxypropanesulfonic acid) and salts thereof, polyvinylsulfonic acid and salts thereof, poly(methacryloyloxyethyltrimethylammonium chloride), polyhydroxyethyl methacrylate, polyhydroxyethyl acrylate, and polyacrylamide. So far as the hydrophilicity is not hindered, these polymers may be a copolymer, or may be used singly or in admixture of two or more thereof. The amount of the organic hydrophilic polymer to be used is from 20% by weight to 99% by weight, preferably from 25% by weight to 95% by weight, and more preferably from 30% by weight to 90% by weight based on the weight of the total solids content.

In the invention, it is possible to carry out the crosslinking of the organic hydrophilic polymer with known crosslinking agents.

Examples of the known crosslinking agents include polyfunctional isocyanate compounds, polyfunctional epoxy compounds, polyfunctional amine compounds, polyol compounds, polyfunctional carboxyl compounds, aldehyde compounds, polyfunctional (meth)acrylic compounds, polyfunctional vinyl compounds, polyfunctional mercapto compounds, polyvalent metal salt compounds, polyalkoxysilane compounds and hydrolyzates thereof, polyalkoxytitanium compounds and hydrolyzates thereof, polyalkoxyaluminum compounds and hydrolyzates thereof, polymethylol compounds, and polyalkoxymethyl compounds. It is also possible to add known reaction catalysts to promote the reaction.

The amount of the crosslinking agent to be used is from 1% by weight to 50% by weight, preferably from 3% by weight to 40% by weight, and more preferably from 5% by weight to 35% by weight based on the weight of the total solids content in the coating solution for hydrophilic layer.

The system capable of undergoing the sol-gel convention, which can be used in the formation of the inorganic hydrophilic matrix of the hydrophilic layer of the invention, is a high-molecular material taking a resin-like structure in which bonding groups come from the polyvalent element form a network structure via an oxygen atom, and the polyvalent metal has uncombined hydroxyl groups and alkoxy groups at the same time, both of which are jointly present. When large amounts of the hydroxyl groups and alkoxy groups are present, the system is in a sol state, and as the ether bonding proceeds, the network resin structure becomes firm. Further, this system also has a function such that when a part of the hydroxyl groups is bound to the solid fine particles, not only the surfaces of the solid fine particles are modified, but also the hydrophilicity is changed. Examples of the polyvalent binding element of the compound having hydroxyl groups and alkoxy groups for undergoing the sol-gel conversion include aluminum, silicon, titanium, and zirconium, and any of these metals can be used in the invention. The sol-gel conversion system by siloxane bonding, which can be most preferably used, will be hereunder described. The sol-gel conversion using aluminum, titanium or zirconium can be carried out by replacing silicon by each of the elements in the following description.

That is, a system containing a silane compound having at least one silanol group, which can undergo the sol-gel conversion, is especially preferably used.

The system utilizing the sol-gel conversion will be further described below. The inorganic hydrophilic matrix that is formed by the sol-gel conversion is preferably a resin having a siloxane bond and a silanol group. During the time when a coating solution as a sol gel containing a silane compound having at least one silanol group is applied, dried and allowed to elapse, hydrolytic condensation of the silanol group proceeds, thereby forming a siloxane skeleton structure, and gelation proceeds, thereby forming the inorganic hydrophilic matrix.

Further, for the purposes of enhancing physical properties such as film strength and flexibility, improving coating properties, and regulating hydrophilicity, the foregoing organic hydrophilic polymers and crosslinking agents can be added to the matrix having a gel structure.

The siloxane resin capable of forming a gel structure is represented by the following formula (I), and the silane compound having at least one silanol group is obtained by hydrolysis of a silane compound represented by the following formula (II). The silane compound having at least one silanol group is not always required to be a partial hydrolyzate alone, but may comprise an oligomer having a silane compound partially hydrolyzed thereon or a composite composition of a silane compound and its oligomer.

Formula (I)

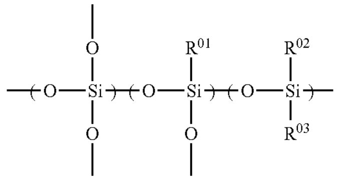

The siloxane-based resin of the foregoing formula (I) is formed by sol-gel conversion of at least one compound of silane compounds represented by the following formula (II). In the formula (I), at least one of $R^{01}$ to $R^{03}$ represents a hydroxyl group, and the other represents an organic residue selected from symbols $R_0$ and Y in the following formula (II).

$$(R_0)_nSi(Y)_{4-n} \qquad \text{Formula (II)}$$

In the formula (II), $R_0$ represents a hydroxyl group, a hydrocarbon group, or a heterocyclic group. Y represents a hydrogen atom, a halogen atom (such as a fluorine atom, a chlorine atom, a bromine atom, and an iodine atom), —$OR_1$, —$OCOR_2$, or —$N(R_3)(R_4)$ (wherein $R_1$ and $R_2$ each represents a hydrocarbon group; and $R_3$ and $R_4$ may be the same or different and each represents a hydrogen atom or a hydrocarbon group); and n is 0, 1, 2 or 3.

In the formula (II), examples of the hydrocarbon group or heterocyclic group represented by $R_0$ include an optionally substituted linear or branched alkyl group having from 1 to 12 carbon atoms (such as a methyl group, an ethyl group, a propyl group, a butyl group, a pentyl group, a hexyl group, a heptyl group, an octyl group, a nonyl group, a decyl group, and a dodecyl group; examples of the substituent on these groups include a halogen atom (such as a chlorine atom, a fluorine atom, and a bromine atom), a hydroxyl group, a thiol group, a carboxyl group, a sulfo group, a cyano group, an epoxy group, an —OR' group (wherein R' represents a methyl group, an ethyl group, a propyl group, a butyl group, a heptyl group, a hexyl group, an octyl group, a decyl group, a propenyl group, a butenyl group, a hexenyl group, an octenyl group, a 2-hydroxyethyl group, a 3-chloropropyl group, a 2-cyanoethyl group, an N,N-dimethylaminoethyl group, a 1-bromoethyl group, a 2-(2-methoxyethyl) oxyethyl group, a 2-methoxycarbonylethyl group, a 3-carboxypropyl group, or a benzyl group), an —OCOR" group (wherein R" has the same meanings as defined above for R'), a —COOR" group, a —COR" group, an —N(R''')(R''') (wherein R'''s may be the same or different and each represents a hydrogen atom or has the same meanings as defined above for R'), an —NHCONHR" group, an —NHCOOR" group, an —Si(R")$_3$ group, a —CONHR''' group, and an —NHCOR" group; and a plural number of these substituents may be substituted in the alkyl group); an optionally substituted linear or branched alkenyl group having from 2 to 12 carbon atoms (such as a vinyl group, a propenyl group, a butenyl group, a pentenyl group, a hexenyl group, an octenyl group, a decenyl group, and a dodecenyl group; and examples of the substituent on these groups are the same as those of the substituent as enumerated above for the alkyl group); an optionally substituted aralkyl group having from 7 to 14 carbon atoms (such as a benzyl group, a phenethyl group, a 3-phenylpropyl group, a naphthylmethyl group, and a 2-naphthylethyl group; examples of the substituent on these groups are the same as those of the substituent as enumerated above for the alkyl group; and a plural number of these substituents may be substituted in the aralkyl group); an optionally substituted alicyclic group having from 5 to 10 carbon atoms (such as a cyclopentyl group, a cyclohexyl group, a 2-cyclohexylethyl group, a 2-cyclopentylethyl group, a norbonyl group, and an adamantyl group; examples of the substituent on these groups are the same as those of the substituent as enumerated above for the alkyl group; and a plural number of these substituents may be substituted in the alicyclic group); an optionally substituted aryl group having from 6 to 12 carbon atoms (such as a phenyl group and a naphthyl group; examples of the substituent on these groups are the same as those of the substituent as enumerated above for the alkyl group; and a plural number of these substituents may be substituted in the aryl group); and optionally fused heterocyclic group containing at least one atom selected from a nitrogen atom, an oxygen atom, and a sulfur atom (such as a pyran ring, a furan ring, a thiophene group, a morpholine ring, a pyrrole ring, a thiazole ring, an oxazole ring, a pyridine ring, a piperidine ring, a pyrrolidone ring, a benzothiazole ring, a benzoxazole ring, a quinoline ring, and a tetrahydrofuran ring; examples of the substituent on these groups are the same as those of the substituent as enumerated above for the alkyl group; and a plural number of these substituents may be substituted in the heterocyclic group).

Examples of the substituent of the —$OR_1$ group, —$OCOR_2$ group or —$N(R_3)(R_4)$ group represented by Y in the formula (II) are as follows.

In the —OR, group, $R_1$ represents an optionally aliphatic group having from 1 to 10 carbon atoms (such as a methyl group, an ethyl group, a propyl group, a butyl group, a heptyl group, a hexyl group, a pentyl group, an octyl group, a nonyl group, a decyl group, a propenyl group, a butenyl group, a heptenyl group, a hexenyl group, an octenyl group, a decenyl group, a 2-hydroxyethyl group, a 2-hydroxypropyl group, a 2-methoxyethyl group, a 2-(methoxyethyloxo)ethyl group, a 1-(N,N-diethylamino)ethyl group, a 2-methoxypropyl group, a 2-cyanoethyl group, a 3-methyloxapropyl group, a 2-chloroethyl group, a cyclohexyl group, a cyclopentyl group, a cyclooctyl group, a chlorocyclohexyl group, a methoxy-cyclohexyl group, a benzyl group, a phenethyl group, a dimethoxybenzyl group, a methylbenzyl group, and a bromobenzyl group).

In the —$OCOR_2$ group, $R_2$ represents an aliphatic group having the same meanings as defined above for $R_1$ or an optionally substituted aromatic group having from 6 to 12 carbon atoms (examples of the aromatic group are those enumerated above for the aryl group in R).

Also, in the —$N(R_3)(R_4)$ group, $R_3$ and $R_4$ may be the same or different and each represents a hydrogen atom or an optionally substituted aliphatic group having from 1 to 10 carbon atoms (such as those enumerated above for $R_1$ of the —$OR_1$ group). More preferably, the total sum of carbon atoms of $R_3$ and $R_4$ is within 16.

Specific examples of the silane compound represented by the formula (II) will be given below, but it should not be construed that the invention is limited thereto.

That is, examples include tetrachlorosilane, tetrabromosilane, tetramethoxysilane, tetraethoxysilane, tetraisopropoxysilane, tetra-n-propylsilane, tetra-t-butoxysilane, tetra-n-butoxysilane, dimethoxydiethoxysilane, methyltrichlorosilane, methylbribromosilane, methyltrimethoxysilane, methyltriethoxysilane, methyltriisopropoxysilane, methyltri-n-butoxysilane, ethyltrichorosilane, ethyltribromosilane, ethyltrimethoxysilane, ethyltriethoxysilane, ethyltriisopropoxysilane, ethyltri-t-butoxysilane, n-propyltrichlorosilane, n-propyltribromosilane, n-propyltrimethoxysilane, n-propyltriethoxysilane, n-propyltriisopropoxysilane, n-propyltri-t-butoxysilane, n-hexyltrichlorosilane, n-hexyltribromosilane, n-hexyltrimethoxysilane, n-hexyltriethoxysilane, n-hexyltriisopropoxysilane, n-hexyltri-t-butoxysilane, n-decyltrichlorosilane, n-decyltribromosilane, n-decyltriemthoxysilane, n-decyltriethoxysilane, n-decyltriisopropoxysilane, n-decyltri-t-butoxysilane, n-octadecyltrichlorosilane, n-octadecyltribromosilane, n-octadecyltrimethoxysilane, n-octadecyltriethoxysilane, n-octadecyltriisopropoxysilane, n-octadecyltri-t-butoxysilane, phenyltrichlorosilane, phenyltribromosilane, phenyltrimethoxysilane, phenyltriethoxysilane, phenyltriisopropoxysilane, phenyltri-t-butoxysilane, dimethyldichlorosilane, dimethyldibromosilane, dimethyldimethoxysilane, dimethyldiethoxysilane, diphenyldichlorosilane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, triethoxyhydrosilane, tribromohydrosilane, trimethoxyhydrosilane, isopropoxyhydrosilane, tri-t-butoxyhydrosilane, vinyltrichlorosilane, vinyltribromosilane, vinyltrimethoxysilane, vinyltriethoxysilane, vinyltriisopropoxysilane, vinyltri-t-butoxysilane, trifluoropropyltrichlorosilane, trifluoropropyltribromosilane, trifluoropropyltriemthoxysilane, trifluoropropyltriethoxysilane, trifluoropropyltriisopropoxysilane, trifluoropropyltri-t-butoxysilane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri-t-butoxysilane, γ-methacryloxypropylmethyldimethoxysilane, γ-methacryloxypropylmethyldiethoxysilane, γ-methacryloxypropyltrimethoxysilane, γ-methacryloxypropyltriisopropoxysilane, γ-methacryloxypropyltri-t-butoxysilane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri-t-butoxysilane, γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-t-butoxysilane, β-(3,4-epoxycyclohexyl)ethyltrimethoxysilane, and β-(3,4-epoxycyclohexyl)ethyltriethoxysilane.

Metallic compounds capable of forming a film upon binding with the resin during the sol-gel conversion, such as Ti, Zn, Sn, Zr, and Al, can be used along with the silane compound represented by the formula (II), which is used in the formation of the inorganic hydrophilic matrix of the hydrophilic layer of the invention.

Examples of the metallic compounds to be used include $Ti(OR_5)_4$ (wherein $R_5$ represents a methyl group, an ethyl group, a propyl group, a butyl group, a pentyl group, or a hexyl group), $TiCl_4$, $Ti(CH_3COCHCOCH_3)_2(OR_5)_2$, $Zn(OR_5)_2$, $Zn(CH_3COCHCOCH_3)_2$, $Sn(OR_5)_4$, $Sn(CH_3COCHCOCH_3)_4$, $Sn(OCOR_5)_4$, $SnCl_4$, $Zr(OR_5)_4$, $Zr(CH_3COCHCOCH_3)_4$, $Al(OR_5)_3$, and $Al(CH_3COCHCOCH_3)_3$.

In addition, in order to promote the hydrolysis and polycondensation reaction of the silane compound represented by the formula (II) and also, the metallic compound to be used jointly, it is preferred to jointly use an acid catalyst or basic catalyst.

As the catalyst, acids or basic compounds are used as they are, or solutions of an acid or a basic compound in water or a solvent (such as alcohols) are used (they are hereunder referred to as "acid catalysts" and "basic catalysts", respectively). The concentration of the catalyst is not particularly limited, but in the case where the concentration is high, the hydrolysis and polycondensation rate is liable to become fast. However, when a basic catalyst having a high concentration is used, there may be the case where a precipitate is formed in the sol solution. Accordingly, it is desired that the concentration of the basic catalyst is 1N (as reduced into a concentration in the aqueous solution) or less.

The kind of the acid catalyst or basic catalyst is not particularly limited. But, specific examples of the acid catalyst include hydrogen halides (such as hydrochloric acid), nitric acid, sulfuric acid, sulfurous acid, hydrogen sulfide, perchloric acid, hydrogen peroxide, carbonic acid, carboxylic acids (such as formic acid and acetic acid), substituted carboxylic acids represented by the structural formula, RCOOH wherein R is substituted with other element or substituent, and sulfonic acids (such as benzenesulfonic acid). Specific examples of the basic catalyst include ammoniacal bases such as ammonia water and amines such as ethylamine and aniline.

The details of the foregoing sol-gel method are described in books such as Sumio Sakka, *ZORU-GERU HO NO KAGAKU* (Science of Sol-Gel Method), published by Agune Shofukan (1988) and Hiroshi Hirashima, *SAISHIN ZORU-GERU HO NIYORU KINOSEI HAKUMAKU SAKUSEI GIJUTSU* (Newest Thin-Film Formation Technology by Sol-Gel Method), published by Sogo Gijutsu Center (1992).

In the hydrophilic layer of the organic or inorganic hydrophilic matrix of the invention, in addition to the foregoing compounds, various compounds can be added for the purposes of controlling the degree of hydrophilicity, enhancing the physical strength of the hydrophilic layer, enhancing the dispersibility among the compounds constructing the layers, enhancing the coating properties, and enhancing the adaptability to printing. Examples include plasticizers, pigments, dyes, surfactants, and hydrophilic particles.

The hydrophilic particles are not particularly limited, but preferred examples include silica, alumina, titanium oxide, magnesium oxide, magnesium carbonate, and calcium alginate. They can be used for promoting the hydrophilicity or reinforcing the film. Among them are more preferable silica, alumina, titanium oxide, and mixtures thereof.

In the hydrophilic layer of the organic or inorganic hydrophilic matrix of the invention, it is an especially preferred embodiment that metallic oxide particles such as silica, alumina, and titanium oxide are contained.

The silica has many hydroxyl groups on the surface thereof and constructs a siloxane bonding (—Si—O—Si—) in the inner portion thereof.

In the invention, the silica that can be preferably used is also called colloidal silica, which is a silica superfine particle dispersed in water or a polar solvent and having a particle size of from 1 to 100 nm. The details are described in Toshiro Kagami and Ei Hayashi Ed., *KOJUNDO SHIRIKA NO OYO GIJUTSU* (Application Technology of High-Purity Silca), Vol. 3, published by CMC Publishing Co., Ltd. (1991).

Further, the alumina that can be preferably used is an alumina hydrate (boehmite-based) having a colloid size of from 5 to 200 nm, which is dispersed in water with, as a stabilizer, anions (such as halogen atom ions such as a fluorine ion and a chlorine ion and carboxylic acid anions such as an acetic acid ion).

Moreover, the titanium oxide that can be preferably used is anatase type or rutile type titanium oxide having a mean primary particle size of from 50 to 500 nm, which is dispersed in water or a polar solvent using a dispersing agent, if desired.

In the invention, the mean primary particle size of the hydrophilic particles that can be preferably used is from 1 to 5,000 nm, and more preferably from 10 to 1,000 nm.

In the hydrophilic layer of the invention, these hydrophilic particles may be used singly or in admixture of two or more thereof. The amount of the hydrophilic particles to be used is from 5% by weight to 90% by weight, preferably from 10% by weight to 70% by weight, and more preferably from 20% by weight to 60% by weight based on the weight of the total solids content of the hydrophilic layer.

The hydrophilic layer of the organic or inorganic hydrophilic matrix to be used in the invention is dissolved or dispersed in water or a suitable single solvent (such as polar solvents including methanol and ethanol) or a mixed solvent thereof and then applied on the support, followed by drying and hardening.

The application weight is suitably from 0.1 to 5 $g/m^2$, preferably from 0.3 to 3 $g/m^2$, and more preferably from 0.5 to 2 $g/m^2$ in terms of the weight after drying. When the application weight of the hydrophilic layer after drying is lower than 0.1 $g/m^2$, there are caused undesired results such as a reduction of the retention properties of the hydrophilic component such as dampening water and a reduction of the film strength. On the other hand, when it is too high, the film becomes brittle, causing undesired results such as a reduction of resistance to printing.

The organic thin film having a metallic oxide-containing surface to be used in the hydrophilic layer of the invention is not particularly limited so far as the surface of the tin film is constructed of the hydrophilic metallic oxide, and it includes thin films of a metal or metallic compound having a hydrophilic metallic oxide on the surface thereof.

Examples of the metal or metallic compound that can be used in the hydrophilic layer of the invention include d-block (transition) metals, f-block (lanthanoid) metals, aluminum, indium, lead, tin, silicon, and alloys thereof, and corresponding metallic oxides, metallic carbides, metallic nitrides, metallic borides, metallic sulfides, and metallic halides. These may be used in admixture (including homogeneous mixed films, heterogeneous mixed films, and laminated films).

Among them are especially preferable metallic oxide thin films themselves. As the thin film of the metallic oxide, thin films of indium oxide, tin oxide, tungsten oxide, manganese oxide, silicon oxide, titanium oxide, aluminum oxide, or zirconium oxide, or mixed thin films can be suitably used in the hydrophilic layer of the invention.

The surface of a thin film of a metal or metallic oxide is substantially in the state of high oxidation in air and is constructed of a metallic oxide, which can be used in the invention. In the invention, in order to ensure the hydrophilicity of the hydrophilic layer, it is essential that the surface of the inorganic thin film as the hydrophilic layer be constructed of a metallic oxide.

For this reason, in order to promote the oxidation of the surface after the film formation, the resulting thin film surface may be subjected to a processing such as heating processing, humidification processing, and glow discharge processing. In addition, a metallic oxide may be laminated on the thin film surface.

For the thin film formation of a metal or metallic oxide to be used in the hydrophilic layer of the invention, PVD (physical vapor deposition) processes or CDV (chemical vapor deposition) processes such as vacuum vapor deposition, sputtering, and ion plating are properly employed.

For example, in the vacuum vapor deposition, ohmic-resistance heating, high frequency induction heating, electron beam heating, etc. can be employed as the heating mode.

Further, as reactive gases, oxygen or nitrogen may be introduced, or reactive vapor deposition using means such as ozone addition and ion assist may be employed.

In the case where the sputtering is used, pure metals or desired metallic compounds can be used as a target material. When pure metals are used, oxygen or nitrogen is introduced as the reactive gas. As a sputtering power source, can be used a direct current power source, a pulse type direct current power source, or a high frequency power source.

Prior to the thin film formation by the foregoing method, in order to enhance the adhesion to the undercoat layer, substrate degassing by substrate heating, etc., or vacuum glow discharge processing on the undercoat surface may be applied.

For example, in the vacuum glow processing, it is possible to form glow discharge by applying a high frequency to the substrate under a pressure of from about 1 to 10 mtorr and treat the substrate with generated plasma. Further, it is also possible to enhance the effect by increasing the application voltage or introducing a reactive gas such as oxygen and nitrogen.

The thin film of a metal or metallic compound having the hydrophilic surface to be used in the hydrophilic layer of the invention preferably has a thickness of from 10 nm to 3,000 nm, and more preferably from 20 nm to 1,500 nm. When the thickness of the thin film is too thin, there are caused undesired results such as a reduction of the retention properties of dampening water and a reduction of the film strength. On the other hand, when it is too thick, it takes a long period of time for the thin film formation, and hence, such is not preferred from the viewpoint of the production adaptability.

In the case where the foregoing hydrophilic layer is provided on the support of the invention, the surface of the support in the hydrophilic layer side may be subjected to roughing processing by sandblast processing, etc., or surface modification processing by corona processing, etc. from the viewpoints of enhancement of the surface area of the hydrophilic layer and enhancement of the adhesion of the hydrophilic layer to the upper layer.

In the lithographic printing plate precursor of the invention, the thermosensitive layer of the invention is provided on the hydrophilic surface of the support. If desired, an inorganic undercoat layer made of a water-soluble metal salt such as zinc borate, or an organic undercoat layer may be provided therebetween.

Various compounds can be used as the component of the organic undercoat layer. Examples include carboxymethyl cellulose, dextrin, gum arabic, amino group-containing phosphonic acids (such as 2-aminoethylphosphonic acid), organic phosphonic acids (such as optionally substituted phenylphosphonic acids, naphthylphosphonic acids, alkylphosphonic acids, glycerophosphonic acids, methylenediphosphonic acids and ethylenediphosphonic acids), organic phosphoric acids (such as optionally substituted phenylphosphoric acids, naphthylphosphoric acids, alkylphosphoric acids and glycerophosphoric acids), organic phosphinic acids (such as optionally substituted phenylphosphinic acids, naphthylphosphinic acids, alkylphosphinic acids and glycerophosphinic acids), amino acids (such as glycine and β-alanine), and hydrochlorides of a hydroxyl group-containing amine (such as triethanolamine hydrochloride). These compounds may be used in admixture of two or more thereof.

This undercoat layer can be provided in the following methods. That is, there are a method in which a solution of the foregoing organic compound dissolved in water or an organic solvent such as methanol, ethanol, and methyl ethyl ketone, or a mixed solvent thereof is applied on the hydrophilic surface of the support and then dried to provide the organic undercoat layer; and a method in which the support is dipped in a solution of the foregoing organic compound dissolved in water or an organic solvent such as methanol, ethanol, and methyl ethyl ketone, or a mixed solvent thereof to adsorb the organic compound thereon, and the resulting support is rinsed with water, etc. and then dried to provide the organic undercoat layer.

In the former method, the solution of the organic compound having a concentration of from 0.005 to 10% by weight can be applied in various methods.

In the latter method, the concentration of the solution is from 0.01 to 20% by weight, and preferably from 0.05 to 5% by weight; the dipping temperature is from 20 to 90° C., and preferably from 25 to 50° C.; and the dipping time is from 0.1 seconds to 20 minutes, and preferably from 2 seconds to 1 minute. The solution to be used can be regulated to have a pH within the range of from 1 to 12 with a basic substance such as ammonia, triethylamine, and potassium hydroxide, or an acidic substance such as hydrochloric acid and phosphoric acid. The coverage of the undercoat layer is suitably from 2 to 200 $mg/m^2$, and preferably from 5 to 100 $mg/m^2$.

In the support that is used in the invention, from the viewpoint of preventing blocking, it is preferred that the back surface of the support has a maximum roughness depth (Rt) of at least 1.2 μm. In addition, it is preferred that a dynamic or kinetic coefficient of friction (μk) when the back surface of the support (i.e., the back surface of the lithographic printing plate precursor of the invention) slips on the surface of the lithographic printing plate precursor of the invention is 2.6 or less.

The support that is used in the invention has a thickness of from about 0.05 mm to 0.6 mm, preferably from 0.1 mm to 0.4 mm, and especially preferably from 0.15 mm to 0.3 mm.

(Thermosensitive Layer of the First Aspect of the Invention)

The thermosensitive layer contains a finely granular polymer (polymer particle).

As the finely granular polymer that can be used in the invention, those in which finely granular polymers are melt united with each other by heat are preferable, and those having a hydrophilic surface and being dispersible in water are especially preferable. Examples include polyethylene, polystyrene, polyvinyl chloride, polyvinylidene chloride, polymethyl (meth)acrylate, polyethyl (meth)acrylate, polybutyl (meth) acrylate, polyacrylonitrile, polyvinyl acetate, and latices of copolymers thereof. In order to make the surface of the finely granular polymer, there may be employed a method in which hydrophilic polymers such as polyvinyl alcohol and polyethylene glycol or oligomers, or hydrophilic low-molecular compounds are adsorbed on the surface of the finely granular polymer. However, it should not be construed that the invention is limited thereto.

Further, it is preferred that a contact angle (water droplet in air) of the film prepared by applying only the finely granular polymer and drying at a temperature lower than the coagulation temperature of the finely granular polymer is lower than a contact angle (water droplet in air) of the film prepared by applying only the finely granular polymer and drying at a temperature higher than the coagulation temperature of the finely granular polymer. The coagulation temperature of the finely granular polymer is preferably 70° C. or higher, and more preferably 100° C. or higher taking into account the stability with time.

In addition, it is preferred that the finely granular polymer of the invention contains a thermo-reactive functional group for the purpose of enhancing the film strength of image portions.

As the thermo-sensitive functional group-containing finely granular polymer, there are no particular limitations so far as the polymers contain functional groups capable of reacting with functional groups present in other finely granular polymers or functional groups presented in other components in the thermosensitive layer. However, examples include functional group-containing latices.

In these finely granular polymers, the fine granules may react with each other via the functional group. In the case where a hydrophilic resin as described later or a low-molecular compound is contained in the thermosensitive layer, the fine granules may react therewith. Further, different types of functional groups that thermally react with each other may be contained in two or more kinds of finely granular polymers, thereby making the finely granular polymers react with each other.

Examples of the thermo-reactive functional groups include ethylenically unsaturated groups capable of undergoing polymerization reaction (such as an acryloyl group, a methacryloyl group, a vinyl group, and an allyl group), an isocyanate group capable of undergoing addition reaction or a block body thereof, active hydrogen atom-containing functional groups as its reaction counterpart (such as an amino group, a hydroxyl group, and a carboxyl group), an epoxy group capable of undergoing addition reaction, an amino group, a carboxyl group or a hydroxyl group as its reaction counterpart, a carboxyl group and a hydroxyl group or an amino group capable of undergoing condensation reaction, and an acid anhydride and an amino group or a hydroxyl group capable of undergoing ring-opening addition reaction. However, functional groups capable of undergoing any reaction can be used so far as a chemical bond is formed.

Examples of the thermo-reactive functional group-containing finely granular polymer that is used in the thermosensitive layer of the invention include those having an acryloyl group, a methacryloyl group, a vinyl group, an allyl group, an epoxy group, an amino group, a hydroxyl group, a carboxyl group, an isocyanate group, an acid anhydride, or a protective group thereof. The introduction of the functional group into the polymer particles may be performed during the polymerization or by utilizing the polymeric reaction after the polymerization.

In the case where the introduction of the functional group is performed during the polymerization, it is preferred to subject a monomer having such a functional group to emulsion polymerization or suspension polymerization.

Specific examples of the monomer having such a functional group include allyl methacrylate, allyl acrylate, vinyl methacrylate, vinyl acrylate, glycidyl methacrylate, glycidyl acrylate, 2-isocyanatoethyl methacrylate and its block isocyanates with an alcohol, etc., 2-isocyanatoethyl acrylate and its block isocyanates with an alcohol, etc., 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylates, and bifunctional methacrylates. However, it should not be construed that the invention is limited thereto.

Examples of thermo-reactive functional group-free monomers that are copolymerizable with the foregoing monomers include styrene, alkyl acrylates, alkyl methacrylates, acrylonitrile, and vinyl acetate. However, the monomer is not limited thereto so far as it does not have a thermo-reactive functional group.

Examples of the polymeric reaction to be used in the case where the introduction of the thermo-reactive functional group is performed after the polymerization include the polymeric reaction as described in WO96-34316.

Among the foregoing thermo-reactive functional group-containing finely granular polymers are preferable those in which finely granular polymers are melt united with each other by heat. If a chemical reaction takes place by heat to form a chemical bond among the finely granular polymers, or between the finely granular polymer and the added hydrophilic resin or the added low-molecular compound, thereby forming a farm film, it is preferred from the viewpoint of image formation that the finely granular polymers are melt united with each other by heat. But, such is not essential.

The finely granular polymer of the invention preferably has a mean particle size of from 0.01 to 20 μm, more preferably from 0.05 to 2.0 μm, and especially preferably from 0.1 to 1.0 μm. When the mean particle size of the finely granular polymer falls within this range, good resolution and stability with time are obtained.

Further, the addition amount of the finely granular polymer is 50% by weight or more, and more preferably 60% by weight of the solids content of the thermosensitive layer.

In the case where the foregoing thermo-reactive functional group-containing finely granular polymer is used in the thermosensitive layer of the invention, a compound to initiate or promote the reaction may be added, if desired. Examples of the compound to initiate or promote the reaction include compounds capable of generating a radical or cation by heat. Examples include Rofin dimers, trihalomethyl compounds, peroxides, azo compounds, onium salts containing a diazonium salt or a diphenyliodonium salt, acyl phosphines, and imide sulfonates.

Such a compound can be added in an amount ranging from 1 to 20% by weight, and preferably from 3 to 10% by weight of the solids content of the thermosensitive layer. When the addition amount of the compound falls within this range, the developability is not hindered, and a good reaction initiation or promotion effect is obtained.

A hydrophilic resin may be added to the thermosensitive layer of the invention. The addition of the hydrophilic resin brings not only good developability but also enhancement of the film strength of the thermosensitive layer itself.

Examples of the hydrophilic resin include those having a hydrophilic group such as hydroxyl, carboxyl, hydroxyethyl, hydroxypropyl, amino, aminoethyl, aminopropyl, and carboxymethyl.

Specific examples of the hydrophilic resin include gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, a homopolymer or copolymers of hydroxyethyl methacrylate, a homopolymer or copolymers of hydroxyethyl acrylate, a homopolymer or copolymers of hydroxypropyl methacrylate, a homopolymer or copolymers of hydroxypropyl acrylate, a homopolymer or copolymers of hydroxybutyl methacrylate, a homopolymer or copolymers of hydroxybutyl acrylate, polyethylene glycols, hydroxypropylene polymers, polyvinyl alcohols, hydrolyzed polyvinyl acetates having a degree of hydrolysis of at least 60% by weight, and preferably at least 80% by weight, polyvinyl formal, polyvinyl butyral, polyvinylpyrrolidone, a homopolymer or copolymers of acrylamide, a homopolymer or copolymers of methacrylamide, and a homopolymer or copolymers of N-methylolacrylamide.

The addition amount of the hydrophilic resin to the thermosensitive layer is preferably from 5 to 40% by weight, and more preferably from 10 to 30% by weight of the solids content of the thermosensitive layer. When the addition amount of the hydrophilic resin falls within this range, good developability and film strength are obtained.

In the lithographic printing plate precursor of the invention, when a light-heat converting agent is contained in the thermosensitive layer or an adjacent layer thereto (such as the hydrophilic layer, the undercoat layer, and an overcoat layer as described later), it is possible to undergo imagewise recording upon irradiation with laser, etc. As such a light-heat converting agent, any substance capable of absorbing the wavelength of a laser source is employable, and various pigments, dyes and metallic fine particles can be used. Especially, light-absorbing substances having an absorption band in at least a part of the wavelength of from 700 to 1,200 nm are preferable.

Examples of kinds of the pigments include black pigments, brown pigments, red pigments, violet pigments, blue pigments, green pigments, fluorescent pigments, metallic powder pigments, and polymer-binding dyes. Specific examples include insoluble azo pigments, azo lake pigments, condensed azo pigments, chelate azo pigments, phthalocyanine-based pigments, anthraquinone-based pigments, perylene- or perynone-based pigments, thioindigo-based pigments, quinacridone-based pigments, dioixazine-based pigments, isoindolinone-based pigments, quinophthalone-based pigments, dyed lake pigments, azine pigments, nitroso pigments, nitro pigments, natural pigments, fluorescent pigments, inorganic pigments, and carbon black.

These pigments may be used without being subjected to surface processing, or may be used after being subjected to surface processing. As the method of the surface processing, there may be considered a method of coating the surface of the pigment with a hydrophilic resin or an oleophilic resin, a method of adhering a surfactant to the surface of the pigment, and a method of a reactive substance (such as silica sol, alumina sol, silane coupling agents, epoxy compounds, and cyanate compounds) to the surface of the pigment. These surface processing methods are described in *Kinzoku Sekken No Seishitsu To Oyo* (Nature and Application of Metallic Soap), published by Saiwai Shobo Co., Ltd., *Insatsu Ink Gijutsu* (Printing Ink Technology), published by CMC Publishing Co., Ltd. (1984), and *Saishin Ganryo Oyo Gijutsu* (The Newest Pigment Application Technology), published by CMC Publishing Co., Ltd. (1986). Of these pigments, those absorbing infrared rays are preferable because they are suitable for utilization with laser emitting infrared rays. As such pigments absorbing infrared rays, is preferable carbon black.

The pigment preferably has a particle size in the range of from 0.01 μm to 1 μm, and more preferably from 0.01 μm to 0.5 μm.

As the dye, commercially available dyes and known dyes as described in literature references (such as *Dye Handbook*, edited by The Society of Synthetic Organic Chemistry, Japan (1970), *Industrial Chemistry*, "Near Infrared Absorbing Dyes", May 1986, pp. 45–51, and Development and Market Trend of 1990's Functional Dyes, Chapter 2, Section 2.3, published by CMC Publishing Co., Ltd. (1990)) or patents can be utilized.

Specifically, are preferable infrared ray absorbing dyes such as azo dyes, metal complex salt azo dyes, pyrazolone azo dyes, anthraquinone dyes, phthalocyanine dyes, carbonium dyes, quinoneimine dyes, polymethine dyes, and cyanine dyes.

In addition, examples of the useful infrared ray absorbing dyes include the cyanine dyes as described in JP-A-58-125246, JP-A-59-84356, and JP-A-60-78787; the methine dyes as described in JP-A-58-173696, JP-A-58-181690, and JP-A-58-194595; the napthoquinone dyes as described in JP-A-58-112793, JP-A-58-224793, JP-A-59-48187, JP-A-59-73996, JP-A-60-52940, and JP-A-60-63744; the squarylium dyes as described in JP-A-58-112792; the cyanine dyes as described in British Patent No. 434,875; the dyes as described in U.S. Pat. No. 4,756,993; the cyanine dyes as described in U.S. Pat. No. 4,973,572; the dyes as described in JP-A-11-268512; and the phthalocyanine compounds as described in JP-A-10-235883.

Also, the near infrared absorbing sensitizers as described in U.S. Pat. No. 5,156,938 can be suitably used. In addition, the substituted aryl benzo (thio)pyrylium salts as described in U.S. Pat. No. 3,881,924; the trimethylthiapyrylium salts as described in JP-A-57-142645; the pyrylium-based compounds as described in JP-A-58-181051, JP-A-58-220143, JP-A-59-41363, JP-A-59-84248, JP-A-59-84249, JP-A-59-146063, and JP-A-59-146061; the cyanine pigments as described in JP-A-59-216146; the pentamethinethiopyrylium salts as described in U.S. Pat. No 4,283,475; the pyrylium compounds as described in JP-B-5-13514 and JP-B-5-19702; and Epolite III-178, Epolite III-130 and Epolite III-125 manufactured by Epolin, Inc. are suitably used.

Some specific examples will be given below.

(I-1)

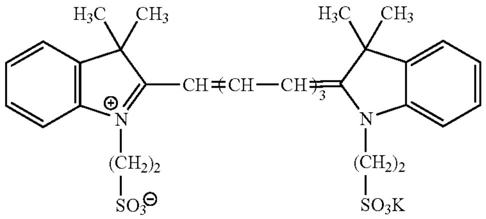

-continued
(I-2)
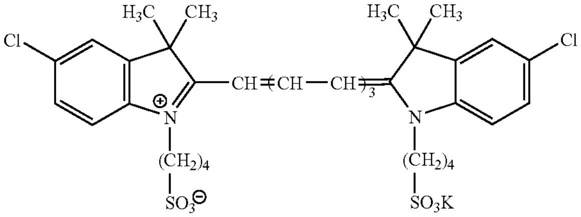
(I-3)
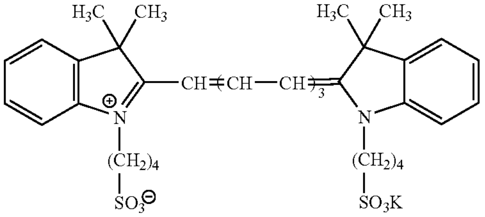
(I-4)
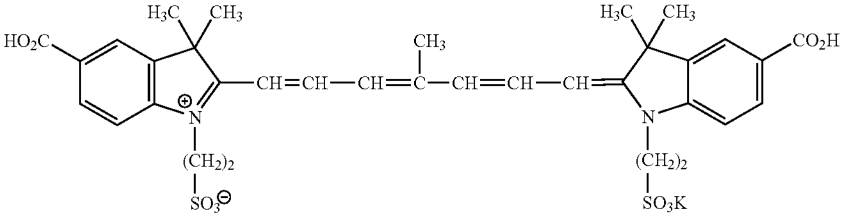
(I-5)
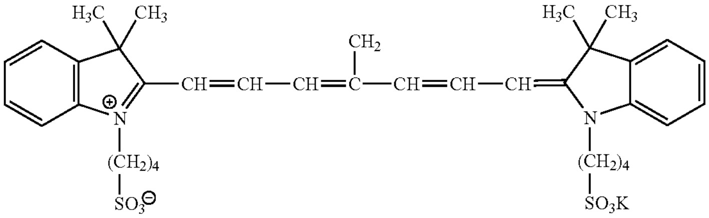
(I-6)
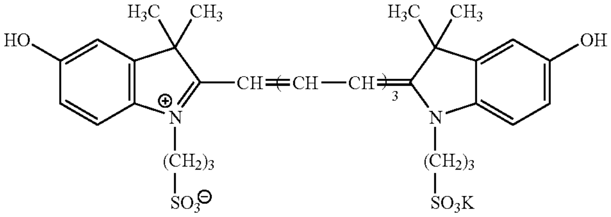
(I-7)
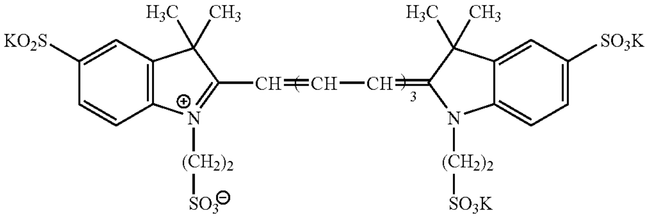
(I-8)
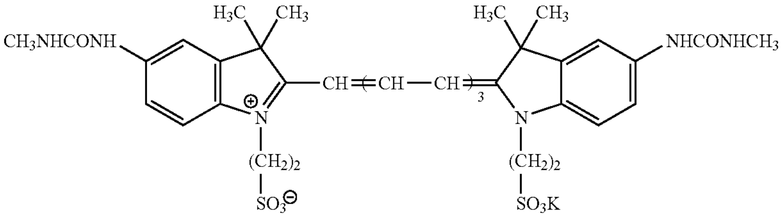

-continued
(I-9)
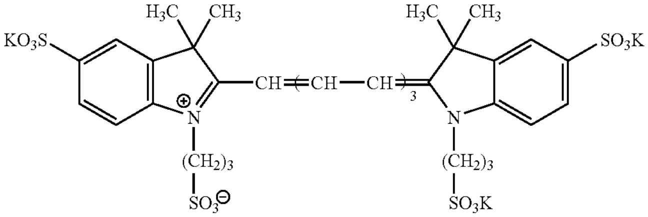
(I-10)
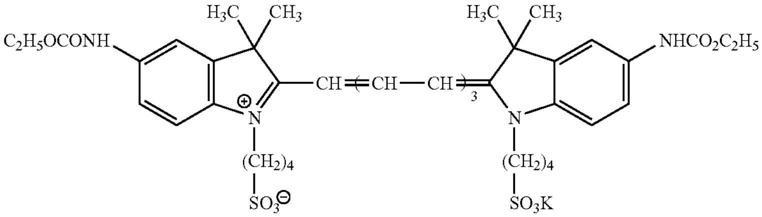
(I-11)
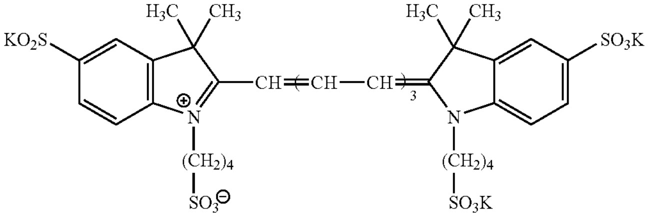
(I-12)
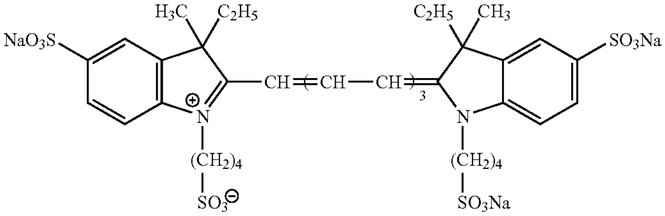
(I-13)
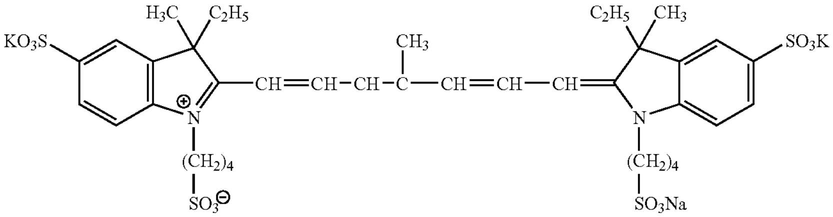
(I-14)
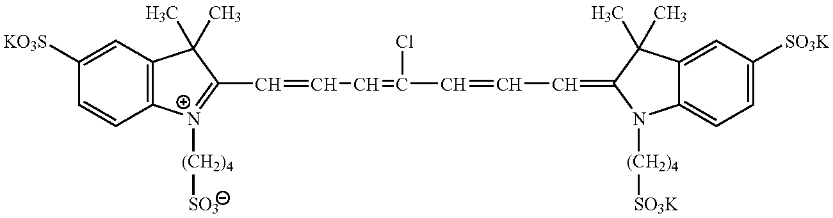
(I-15)
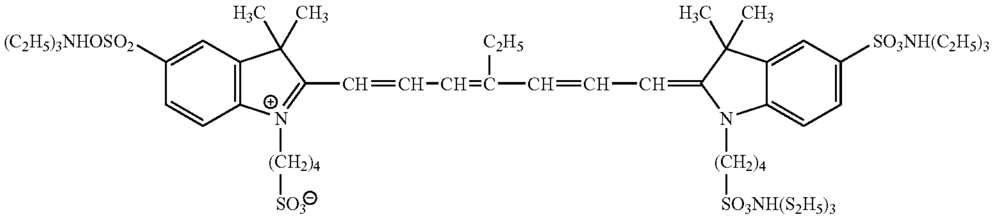

-continued
(I-16)
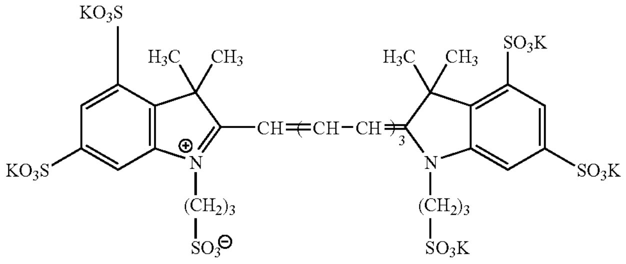
(I-17)
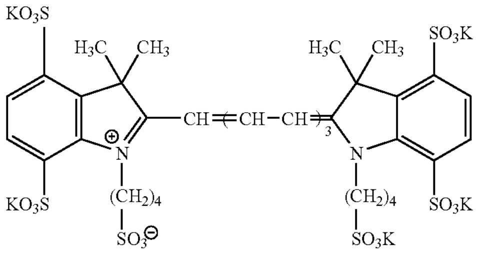
(I-18)
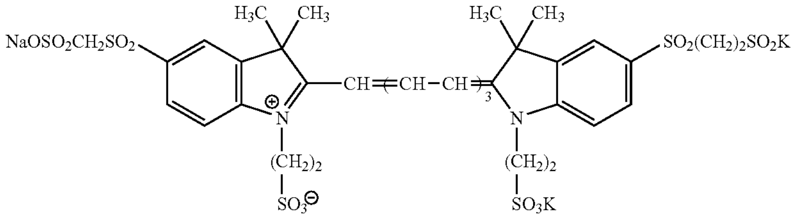
(I-19)
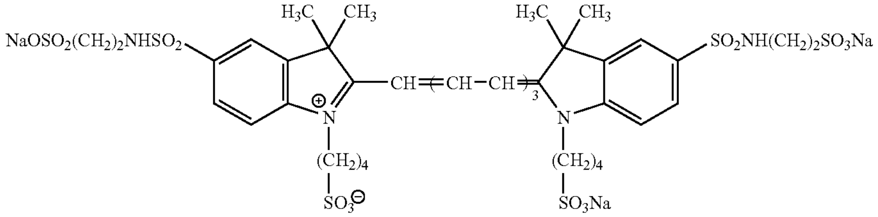
(I-20)
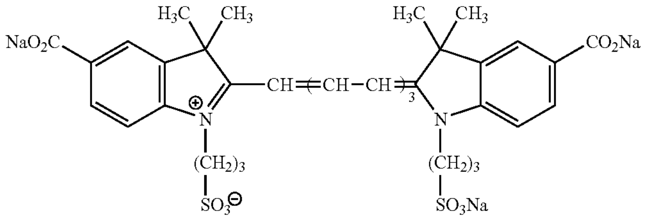
(I-21)
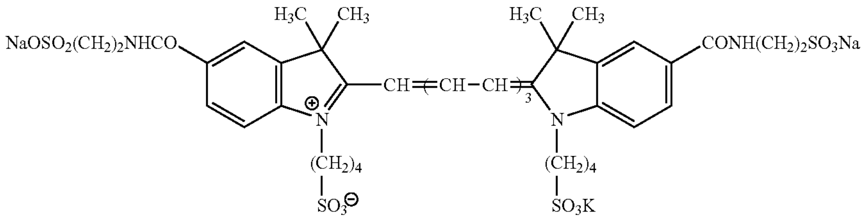

-continued
(I-22)
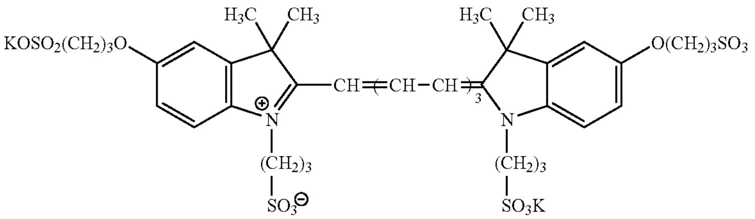
(I-23)
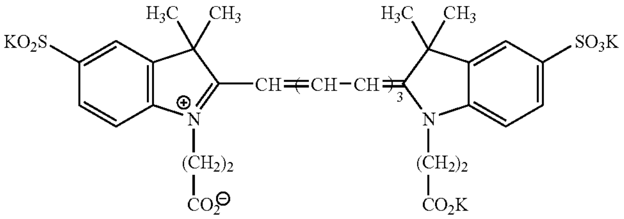
(I-24)
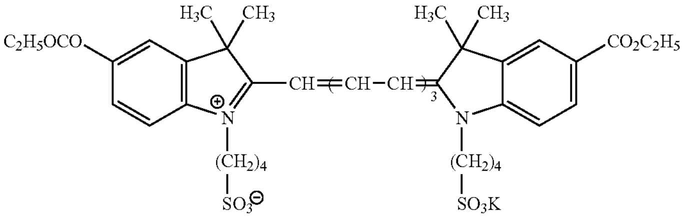
(I-25)
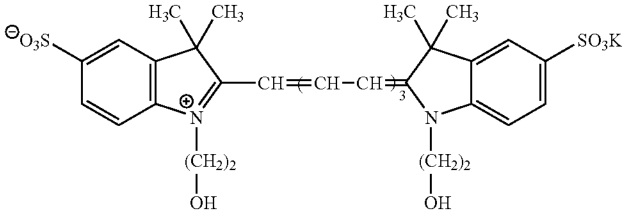
(I-26)
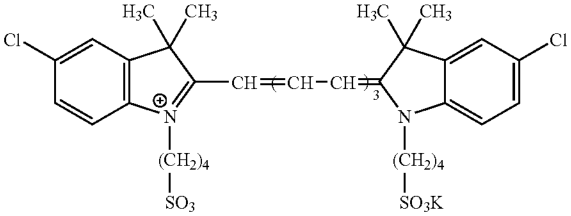
(I-27)
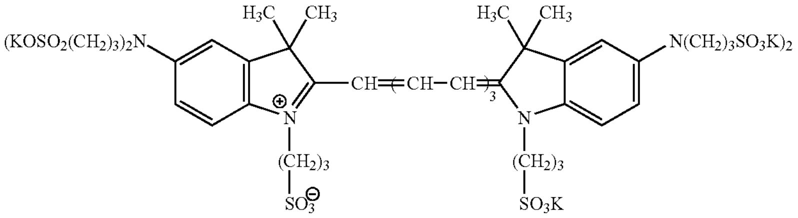
(I-28)
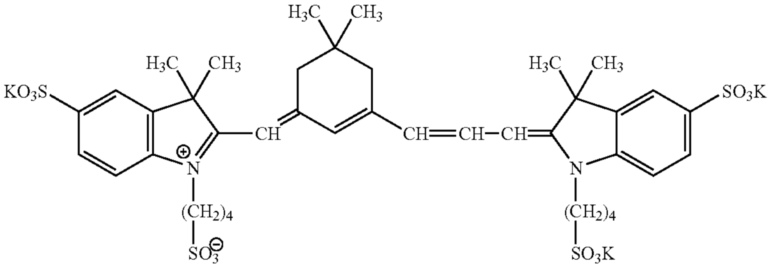

-continued (I-29)

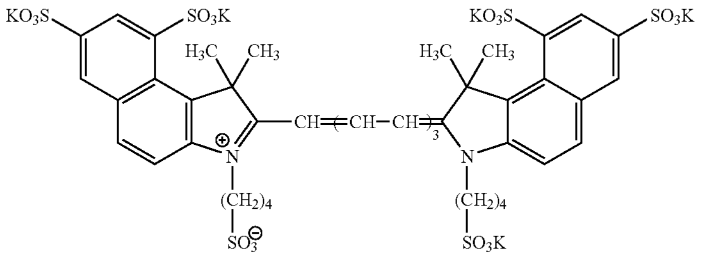

(I-30)

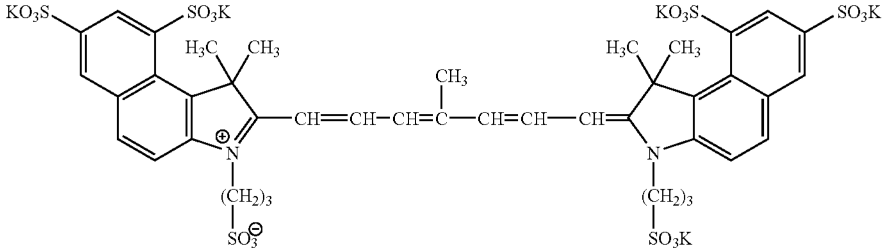

(I-31)

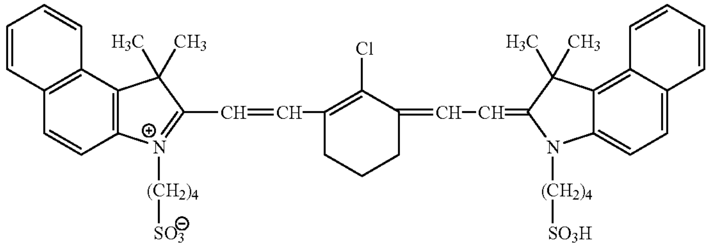

(I-32)

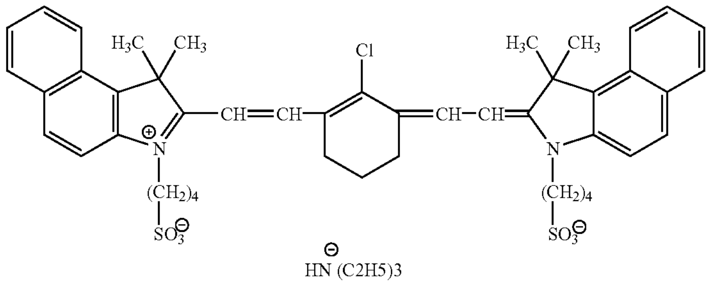

The foregoing organic light-heat converting agent can be added in an amount of up to 30% by weight, preferably from 5 to 25% by weight, and especially preferably from 7 to 20% by weight in the thermosensitive layer. When the addition of the light-heat converting agent falls within this range, good sensitivity is obtained.

In the thermosensitive layer of the invention, metallic fine particles can be used as the light-heat converting agent. Most of metallic fine particles have light-heat converting properties and self-heat build-up properties. As the metallic fine particles, Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, and Sb can be preferably used alone or in the form of alloys thereof. Further, fine particles of oxides or sulfides of these metals can also be preferably used.

Among these metals constructing the metallic fine particles are preferable metals that are easily united by heat upon irradiation with light, have a melting point of about 1,000° C. or lower and have an absorption in an infrared, visible or ultraviolet ray region, such as Re, Sb, Te, Au, Ag, Cu, Ge, Pb, and Sn.

Further, fine particles of metals having a relatively low melting point and having a relative high absorbance to infrared rays, such as Ag, Au, Cu, Sb, Ge, and Pb, are especially preferable, with Ag, Au and Cu being most preferable as the element.

Moreover, the light-heat converting agent may be constructed of two or more kinds of light-heat converting substances such as mixtures of fine particles of low-melting metals (such as Re, Sb, Te, Au, Ag, cu, Ge, Pb, and Sn) and fine particles of self-heat build-up metals (such as Ti, Cr, Fe, Co, Ni, W, and Ge). Also, combinations of fine pieces of metal species that have an especially high absorption when formed into fine pieces, such as Ag, Pt and Pb, and other metal fine pieces can be preferably used.

These particles preferably have a particle size of 10 μm or less, more preferably from 0.003 to 5 μm, and especially preferably from 0.01 to 3 μm. When the particle size of the particle falls within this range, good sensitivity and resolving power are obtained.

In the invention, in the case where such metal fine particles are used as the light-heat converting agent, the addition amount are preferably 10% by weight or more, more preferably 20% by weight or more, and especially preferably 30% by weight or more of the solids content of the thermosensitive layer. When the addition amount of the metal fine particles falls within this range, high sensitivity is obtained.

In the thermosensitive layer of the invention, in the case where the foregoing thermo-reactive functional group-containing finely granular polymer is used, can be contained a low-molecular compound having a functional group capable of reacting with the thermo-reactive functional group in the finely granular polymer and its protective group. The addition amount of such a low-molecular compound is preferably from 5% by weight to 40% by weight, and especially preferably from 5% by weight to 20% by weight in the thermosensitive layer. When the addition amount of the low-molecular compound is lower than the above-specified range, the crosslinking effect is low so that the resistance to printing is not satisfactory. On the other hand, when it exceeds this range, the developability after elapse is worse. Compounds that can be used will be hereunder described.

Examples of the low-molecular compound include compounds having a polymerizable unsaturated group, a hydroxyl group, a carboxyl group, a carboxylate group, an acid anhydride group, an amino group, an epoxy group, an isocyanate group, or a blocked isocyanate group in the molecule thereof.

Examples of compounds having a polymerizable unsaturated group include radical polymerizable compounds having at least one ethylenically unsaturated double bond, which are selected from compounds having at least one, and preferably two or more terminal ethylenically unsaturated bonds. A group of such compounds is widely known in the industrial field of the art, and these compounds can be used without particular limitations in the invention. These compounds have a chemical form including monomers, prepolymers, i.e., dimers, trimers and oligomers, mixtures thereof, and copolymers thereof. Examples of monomers and copolymers thereof include unsaturated carboxylic acids (such as acrylic acid, methacrylic acid, itaconic acid, crotonic acid, isocrotonic acid, and maleic acid) and esters thereof, and amides. Preferably, esters of an unsaturated carboxylic acid and an aliphatic polyhydric alcohol and amides of an unsaturated carboxylic acid and an aliphatic polyhydric amine compound are used. Further, addition reaction products of an unsaturated carboxylic acid ester having a nucleophilic substituent (such as a hydroxyl group, an amino group, and a mercapto group) or an amide and a monofunctional or polyfunctional isocyanate or an epoxy compound, and dehydration condensation reaction products of such an unsaturated carboxylic acid ester or amide and a monofunctional or polyfunctional carboxylic acid are preferably used. Moreover, addition reaction products of an unsaturated carboxylic acid ester having an electrophilic substituent (such as an isocyanate group and an epoxy group) or an amide and a monofunctional or polyfunctional alcohol, amine or thiol, and displacement reaction products of an unsaturated carboxylic acid ester having an eliminating substituent (such as a halogen group and a tosyloxy group) or an amide and a monofunctional or polyfunctional alcohol, amine or thiol are suitably used. Also, compounds obtained by replacing the foregoing unsaturated carboxylic acid with an unsaturated phosphonic acid or styrene can be used as other examples.

Specific examples of the radical polymerizable compounds that are an ester of an aliphatic polyhydric alcohol compound and an unsaturated carboxylic acid include acrylic esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate;

methacrylic esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerithritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane;

itaconic esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonic esters such as ethylene glycol dicrotonate, tetramethylene glycol dicrotonate, pentaerythritol dicrotonate, and sorbitol tetradicrotonate;

isocrotonic esters such as ethylene glycol diisocrotonate, pentaerythritol diisocrotonate, and sorbitol tetraisocrotonate; and maleic esters such as ethylene glycol dimaleate, triethylene glycol dimaleate, pentaerythritol dimaleate, and sortitol tetramaleate.

As other esters, are also suitably used the aliphatic alcohol-based esters as described in JP-B-46-27926, JP-B-51-47334, and JP-A-57-196231; the aromatic skeleton-containing esters as described in JP-A-59-5240, JP-A-59-5241, and JP-A-2-226149; and the amino group-containing esters as described in JP-A-1-165613.

Specific examples of monomers of amides between an aliphatic polyhydric amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine trisacrylamide, xylylene bis-acrylamide, and xylylene bis-methacrylamide.

Examples of other preferred amide-based monomers include those having a cyclohexylene structure as described in JP-B-54-21726.

Further, urethane-based addition polymerizable compounds that are prepared using addition reaction between an isocyanate and a hydroxyl group are suitable. Specific examples include urethane compounds having two or more polymerizable unsaturated groups in one molecule thereof, in which a hydroxyl group-containing unsaturated monomer represented by the following formula (A) is added to a polyisocyanate compound having two or more isocyanate groups in one molecule thereof, as described in JP-B-48-41708.

$$CH_2{=}C(R_m)COOCH_2CH(R_n)OH \qquad \text{Formula (A)}$$

wherein $R_m$ and $R_n$ each represents H or $CH_3$.

Further, the urethane acrylates as described in JP-A-51-37193, JP-B-2-32293, and JP-B-2-16765 and the ethylene oxide-based skeleton-containing urethane compounds as described in JP-B-58-49860, JP-B-56-17654, JP-B-62-39417, and JP-B-62-39418 are also suitable.

In addition, the radical polymerizable compounds having an amino structure or a sulfide structure in the molecule thereof, as described in JP-A-63-277653, JP-A-63-260909, and JP-A-1-105238 may also be used.

Other examples include polyfunctional acrylates or methacrylates such as polyester acrylates and epoxy acrylates obtained by reacting an epoxy resin and (meth)acrylic acid, as described in JP-A-48-64183, JP-B-49-43191, and JP-B-52-30490. Specific unsaturated compounds as described in JP-B-46-43946, JP-B-1-40337, and JP-B-1-40336 and vinylsulfonic acid-based compounds as described in JP-A-2-25493 are also suitable. In some case, the perfluoroalkyl group-containing compounds as described in JP-A-61-22048 can be suitably used. Further, those introduced as photo-curable monomers or oligomers in *Journal of The Adhesion Society of Japan*, Vol. 20, No. 7, pp. 300–308 (1984) can be used.

Preferred examples of the epoxy compounds include glycerin polyglycidyl ether, polyethylene glycol diglycidyl ether, polypropylene diglycidyl ether, trimethylolpropane polyglycidyl ether, sorbitol polyglycidyl ether, and bisphenols or polyphenols or polyglycidyl ethers of hydrolyzates thereof.

Preferred examples of the isocyanate-containing compounds include tolylene diisocyanate, diphenylmethane diisocyanate, polymethylene polyphenyl polyisocyanate, xylylene diisocyanate, naphthalene diisocyanate, cyclohexane phenylene diisocyanate, isophorone diisocyanate, hexamethylene diisocyanate, cyclohexyl diisocyanate, and alcohol- or amine-blocked compounds thereof.

Preferred examples of the amine compounds include ethylenediamine, diethylenetriamine, triethylenetetramine, hexamethylenediamine, propylenediamine, and polyethyleneimine.

Preferred examples of the hydroxyl group-containing compounds include terminal methylol-containing compounds, polyhydric alcohols such as pentaerythritol, bisphenols, and polyphenols.

Preferred examples of the carboxyl group-containing compounds include aromatic polyhydric carboxylic acids such as pyromellitic acid, trimellitic acid, and phthalic acid and aliphatic polyhydric carboxylic acids such as adipic acid.

Preferred examples of the acid anhydride include pyromellitic anhydride and benzophenonetetracarboxylic anhydride.

Further, various compounds other than those described above may be added in the thermosensitive layer of the invention, if desired. For example, in order to make it easy to discriminate the image portions from the non-image portions after the image formation, it is possible to use a dye having large absorption in a visible light region as a coloring agent of the image. Specific examples include Oil Yellow #101, Oil Yellow #103, Oil Pink #312, Oil Green BG, Oil Blue BOS, Oil Blue #603, Oil Black BY, Oil Black BS, and Oil Black T-505 (all being manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and the dyes as described in JP-A-62-293247. Further, phthalocyanine-based pigments, azo-based pigments, and pigments such as titanium oxide can be suitably used. The addition amount of the dye is preferably from 0.01 to 10% by weight based on the total solids content of the coating solution for thermosensitive layer.

In addition, in order to make the image portions and the non-image portions clear upon exposure, it is preferred to add a color developing or color fading compound in the thermosensitive layer of the invention. Examples include thermal acid generators (such as diazo compounds and diphenyl iodonium salts), leuco dyes (such as Leuco Malachite Green, Leuco Crystal Violet, and lactones of Crystal Violet), and pH discoloring dyes (such as dyes including Ethyl Violet and Victoria Pure Blue BOH).

Further, in the invention, in order to prevent unnecessary heat polymerization of the ethylenically unsaturated compound from occurrence during the preparation or preservation of the coating solution for thermosensitive layer, it is desired to add a small amount of a heat polymerization inhibitor. Suitable examples of the heat polymerization inhibitor include hydroquinone, p-methoxyphenol, di-t-butyl-p-cresol, pyrogallol, t-butyl catechol, benzoquinone, 4,4'-thiobis(3-methyl-6-t-butyl-phenol), 2,2'-methylenebis (4-methyl-6-t-butylphenol), and N-nitroso-N-phenylhydroxylamine aluminum salt. The addition amount of the heat polymerization inhibitor is from about 0.01 to 5% by weight on a basis of the weight of the whole of the composition.

Moreover, if desired, in order to prevent polymerization inhibition by oxygen, a higher fatty acid such as behenic acid and behenic amide or a derivative thereof may be added such that it is locally present on the surface of the thermosensitive layer during the drying step after coating. The addition amount of the higher fatty acid or its derivative is preferably from about 0.1 to about 10% by weight of the solids content of the thermosensitive layer.

In addition, in order to impart flexibility of the coating film, etc., a plasticizer can be added to the thermosensitive layer of the invention, if desired. Examples include polyethylene glycol, tributyl citrate, diethyl phthalate, dibutyl phthalate, dihexyl phthalate, dioctyl phthalate, tricresyl phosphate, tributyl phosphate, trioctyl phosphate, and tatrahydrofurfuryl oleate.

The thermosensitive layer of the invention is provided by dispersing or dissolving the respective necessary components to prepare a coating solution, which is then applied. As solvents as used herein, are employable ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyl lactone, toluene, and water. However, it should not be construed that the invention is limited thereto. These solvents are used singly or in admixture. The concentration of the solid components of the coating solution is preferably from 1 to 50% by weight.

Further, the coverage (solids content) of the thermosensitive layer on the support as obtained after drying varies depending on the utilization, but is preferably from 0.4 to 5.0 g/m$^2$. When the coverage of the thermosensitive layer is less than this range, the apparent sensitivity increases, but the film characteristics of the thermosensitive layer functioning the image recording lower. As the application method, various methods can be used. Examples include bar coater coating, rotary coating, spray coating, curtain coating, dip coating, air knife coating, blade coating, and roll coating.

For the purpose of enhancing the coating properties, it is possible to add, for example, a fluorine-based surfactant as described in JP-A-62-170950 in the coating solution for thermosensitive layer. The addition amount of the fluorine-based surfactant is preferably from 0.01 to 1% by weight, and more preferably from 0.05 to 0.5% by weight of the total solids content of the thermosensitive layer.

(Thermosensitive Layer of the Second Aspect of the Invention)

The thermosensitive layer of the invention contains a microcapsule encapsulating an oleophilic compound, and preferably a thermo-reactive functional group-containing compound therein.

Examples of the thermo-reactive functional groups include ethylenically unsaturated groups capable of undergoing polymerization reaction (such as an acryloyl group, a methacryloyl group, a vinyl group, a vinyloxy group, and an allyl group), an isocyanate group capable of undergoing addition reaction or a block body thereof, active hydrogen atom-containing functional groups as its reaction counterpart (such as an amino group, a hydroxyl group, and a carboxyl group), an epoxy group capable of undergoing addition reaction, an amino group, a carboxyl group or a hydroxyl group as its reaction counterpart, a carboxyl group and a hydroxyl group or an amino group capable of undergoing condensation reaction, and an acid anhydride and an amino group or a hydroxyl group capable of undergoing ring-opening addition reaction. However, functional groups capable of undergoing any reaction can be used so far as a chemical bond is formed.

The microcapsule that is used in the invention encapsulates an oleophilic compound, and preferably a thermo-reactive functional group-containing compound. Examples of such an oleophilic compound include compounds having a polymerizable unsaturated group, a hydroxyl group, a carboxyl group, a carboxylate group, an acid anhydride group, an amino group, an epoxy group, an isocyanate group, or a blocked isocyanate group in the molecule thereof.

Examples of compounds having a polymerizable unsaturated group include radical polymerizable compounds having at least one, and preferably two or more ethylenically unsaturated double bonds such as an acryloyl group, a methacryloyl group, a vinyl group, a vinyloxy group, and an allyl group. A group of such compounds is widely known in the industrial field of the art, and these compounds can be used without particular limitations in the invention. These compounds have a chemical form including monomers, prepolymers, i.e., dimers, trimers and oligomers, mixtures thereof, and copolymers thereof.

Examples include unsaturated carboxylic acids (such as acrylic acid, methacrylic acid, itaconic acid, crotonic acid, isocrotonic acid, and maleic acid) and esters thereof, and unsaturated carboxylic acid amides, and preferably esters of an unsaturated carboxylic acid and an aliphatic polyhydric alcohol and amides of an unsaturated carboxylic acid and an aliphatic polyhydric amine compound.

Further, addition reaction products of an unsaturated carboxylic acid ester having a nucleophilic substituent (such as a hydroxyl group, an amino group, and a mercapto group) or an unsaturated carboxylic acid amide and a monofunctional or polyfunctional isocyanate or an epoxy compound, and dehydration condensation reaction products of such an unsaturated carboxylic acid ester or amide and a monofunctional or polyfunctional carboxylic acid are preferably used.

Moreover, addition reaction products of an unsaturated carboxylic acid ester having an electrophilic substituent (such as an isocyanate group and an epoxy group) or an amide and a monofunctional or polyfunctional alcohol, amine or thiol, and displacement reaction products of an unsaturated carboxylic acid ester having an eliminating substituent (such as a halogen group and a tosyloxy group) or an amide and a monofunctional or polyfunctional alcohol, amine or thiol are suitably used.

Also, compounds obtained by replacing the foregoing unsaturated carboxylic acid with an unsaturated phosphonic acid or styrene can be used as other suitable examples.

Specific examples of the polymerizable compounds that are an ester of an unsaturated carboxylic acid and an aliphatic polyhydric alcohol compound are as follows. As acrylic esters, can be enumerated ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate.

As methacrylic esters, can be enumerated tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerithritol dimethacrylate, dipentaerythritol hexamethacrylate, sorbitol trimethacrylate, sorbitol tetramethacrylate, bis[p-(3-methacryloyloxy-2-hydroxypropoxy)phenyl]dimethylmethane, and bis[p-(methacryloyloxyethoxy)phenyl]dimethylmethane.

As itaconic esters, can be enumeraed ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

As crotonic esters, can be enumerated ethylene glycol dicrotonate, tetramethylene glycol dicrotonate, pentaerythritol dicrotonate, and sorbitol tetradicrotonate.

As isocrotonic esters, can be enumerated ethylene glycol diisocrotonate, pentaerythritol diisocrotonate, and sorbitol tetraisocrotonate.

As maleic esters, can be enumerated ethylene glycol dimaleate, triethylene glycol dimaleate, pentaerythritol dimaleate, and sortitol tetramaleate.

As other esters, can be enumerated the aliphatic alcohol-based esters as described in JP-B-46-27926, JP-B-51-47334, and JP-A-57-196231; the aromatic skeleton-containing esters as described in JP-A-59-5240, JP-A-59-5241, and JP-A-2-226149; and the amino group-containing esters as described in JP-A-1-165613.

As specific examples of monomers of amides between an aliphatic polyhydric amine compound and an unsaturated carboxylic acid, can be enumerated methylene bis-acrylamide, methylene bis-methacrylamide, 1,6-hexamethylene bis-acrylamide, 1,6-hexamethylene bis-methacrylamide, diethylenetriamine trisacrylamide, xylylene bis-acrylamide, and xylylene bis-methacrylamide.

Examples of other preferred amide-based monomers include those having a cyclohexylene structure as described in JP-B-54-21726.

Further, urethane-based addition polymerizable compounds that are prepared using addition reaction between an isocyanate and a hydroxyl group are suitable. Specific examples include urethane compounds having two or more polymerizable unsaturated groups in one molecule thereof, in which a hydroxyl group-containing unsaturated monomer represented by the following formula (A) is added to a polyisocyanate compound having two or more isocyanate groups in one molecule thereof, as described in JP-B-48-41708.

$$CH_2{=}C(R_m)COOCH_2CH(R_n)OH \qquad \text{Formula (A)}$$

wherein $R_m$ and $R_n$ each represents H or $CH_3$.

Further, the urethane acrylates as described in JP-A-51-37193, JP-B-2-32293, and JP-B-2-16765 and the ethylene oxide-based skeleton-containing urethane compounds as described in JP-B-58-49860, JP-B-56-17654, JP-B-62-39417, and JP-B-62-39418 can be suitably enumerated.

In addition, the radical polymerizable compounds having an amino structure or a sulfide structure in the molecule thereof, as described in JP-A-63-277653, JP-A-63-260909, and JP-A-1-105238 can also be suitably enumerated.

Other suitable examples include polyfunctional acrylates or methacrylates such as polyester acrylates and epoxy acrylates obtained by reacting an epoxy resin and (meth) acrylic acid, as described in JP-A-48-64183, JP-B-49-43191, and JP-B-52-30490. Specific unsaturated compounds as described in JP-B-46-43946, JP-B-1-40337, and JP-B-1-40336 and vinylsulfonic acid-based compounds as described in JP-A-2-25493 are also suitable. In some case, the perfluoroalkyl group-containing compounds as described in JP-A-61-22048 can be suitably used. Further, those introduced as photo-curable monomers or oligomers in *Journal of The Adhesion Society of Japan*, Vol. 20, No. 7, pp. 300–308 (1984) can be used.

As suitable examples of copolymers of an ethylenically unsaturated compound, can be enumerated copolymers of allyl methacrylate. Examples include allyl methacrylate/methacrylic acid copolymers, allyl methacrylate/ethyl methacrylate copolymers, and allyl methacrylate/butyl methacrylate copolymers.

As vinyloxy group-containing compounds, are preferable compounds having two or more vinyloxy groups in the molecule thereof. These compounds can be synthesized by reaction of a polyhydric alcohol or a polyhydric phenol with acetylene, or reaction of a polyhydric alcohol or a polyhydric phenol with a halogenated alkyl vinyl ether.

Specific examples include ethylene glycol divinyl ether, triethylene glycol divinyl ether, 1,3-butanediol divinyl ether, tetramethylene glycol divinyl ether, neopentyl glycol divinyl ether, trimethyloylpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,2-di(vinyl ether methoxy)benzene, and 1,2-di(vinyl ether ethoxy)benzene.

Suitable examples of the epoxy compounds include glycerin polyglycidyl ether, polyethylene glycol diglycidyl ether, polypropylene diglycidyl ether, trimethylolpropane polyglycidyl ether, sorbitol polyglycidyl ether, and bisphenols or polyphenols or polyglycidyl ethers of hydrolyzates thereof.

Suitable examples of the isocyanate compounds include tolylene diisocyanate, diphenylmethane diisocyanate, polymethylene polyphenyl polyisocyanate, xylylene diisocyanate, naphthalene diisocyanate, cyclohexane phenylene diisocyanate, isophorone diisocyanate, hexamethylene diisocyanate, cyclohexyl diisocyanate, and alcohol- or amine-blocked compounds thereof.

Suitable examples of the amine compounds include ethylenediamine, diethylenetriamine, triethylenetetramine, hexamethylenediamine, propylenediamine, and polyethyleneimine.

Suitable examples of the hydroxyl group-containing compounds include terminal methylol-containing compounds, polyhydric alcohols such as pentaerythritol, bisphenols, and polyphenols.

Suitable examples of the carboxyl group-containing compounds include aromatic polyhydric carboxylic acids such as pyromellitic acid, trimellitic acid, and phthalic acid and aliphatic polyhydric carboxylic acids such as adipic acid.

Suitable examples of the acid anhydride include pyromellitic anhydride and benzophenonetetracarboxylic anhydride.

As the encapsulating method, known methods can be applied. Examples of the method of manufacture of microcapsules include a method of utilizing coacervation as seen in U.S. Pat. Nos. 2,800,457 and 2,800,458; a method by interface polymerization as seen in British Patent No. 990,443, U.S. Pat. No. 3,287,154, JP-B-38-19574, JP-B-42-446, and JP-B-42-711; a method by deposition of polymers as seen in U.S. Pat. Nos. 3,418,250 and 3,660,304; a method of using an isocyanate polyol wall material as seen in U.S. Pat. No. 3,796,669; a method of using an isocyanate wall material as seen in U.S. Pat. No. 3,914,511; a method of using a urea-formaldehyde-based or urea-formaldehyde-resorcinol-based wall forming material as seen in U.S. Pat. Nos. 4,001,140, 4,087,376 and 4,089,802; a method of using a wall material such as a melamine-formaldehyde resin and hydroxycellulose, as seen in U.S. Pat. No. 4,025,445; an in site method by monomer polymerization as seen in JP-B-36-9163 and JP-B-51-9079; a spray drying method as seen in British Patent No. 930,422 and U.S. Pat. No. 3,111,407; and an electrolytic dispersion cooling method as seen in British Patent Nos. 952,807 and 967,074. However, it should not be construed that the invention is limited thereto.

Preferably, the microcapsule wall that is used in the invention has three-dimensional crosslinking and has a property such that it is swollen by a solvent. From these viewpoints, preferred examples of the microcapsule wall material include polyureas, polyurethanes, polyesters, polycarbonates, polyamides, and mixtures thereof, with polyureas and polyurethanes being especially preferred. An oleophilic compound may be introduced into the microcapsule wall.

The microcapsule preferably has a mean particle size of from 0.01 to 20 μm, more preferably from 0.05 to 2.0 μm, and especially preferably from 0.10 to 1.0 μm. When the mean particle size of the microcapsule falls within this range, good resolution and stability with time are obtained.

The microcapsules may or may not be united with each other by heat. In a word, it is only required that among the contents encapsulated in the microcapsule, those which bleed on the capsule surface or out the microcapsule, or those which invade the microcapsule wall, cause chemical reaction by the heat. The contents encapsulated in the microcapsule may react with the added hydrophilic resin or added low-molecular compound. Further, by containing different functional groups that thermally react with each other in two or more kinds of microcapsules, the microcapsules may react with each other.

Accordingly, it is preferred from the viewpoint of image formation that the microcapsules are melt united with each other by heat. But, such is not essential.

The addition amount of the microcapsule is preferably 50% by weight or more, and more preferably from 60 to 95% by weight as reduced into the solids content. When the addition amount of the microcapsule falls within this range, not only good developability but also good sensitivity and resistance to printing are obtained.

In the case where the microcapsule is added to the thermo-sensitive layer, it is possible to add a solvent in which the contents encapsulated in the microcapsule are dissolved and by which the wall material is swollen to the microcapsule dispersion medium. By using such a solvent, diffusion of the encapsulated oleophilic compound outside the microcapsule is promoted.

The solvent relies upon the microcapsule dispersion medium, the material quality of the microcapsule wall, the wall thickness, and the contents encapsulated in the microcapsule, but can be easily selected from many commercially available solvents. In the case of a water-dispersible microcapsule made of a crosslinked polyureas or polyurethane wall, preferred examples of the solvent include alcohols, ethers, acetals, esters, ketones, polyhydric alcohols, amides, amines, and fatty acids.

Specific examples include methanol, ethanol, tertiary butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyl lactone, N,N-dimethylformamide, and N,N-dimethylacetamide, but it should not be construed that the invention is limited thereto. These solvents may be used in admixture of two or more thereof.

Solvents in which the microcapsule dispersion is not dissolved but becomes soluble upon mixing with the foregoing solvent may be used. The addition amount of the solvent is determined by the combination of the materials, but usually, is preferably in the range of from 5 to 95% by weight, more preferably from 10 to 90% by weight, and especially preferably from 15 to 85% by weight of the coating solution.

Since the microcapsule encapsulating an oleophilic compound therein is used is used in the thermosensitive layer of the invention, a compound to initiate or promote the reaction may be added, if desired. Examples of the compound to initiate or promote the reaction include compounds capable of generating a radical or cation by heat. Examples include Rofin dimers, trihalomethyl compounds, peroxides, azo compounds, onium salts containing a diazonium salt or a diphenyliodonium salt, acyl phosphines, and imide sulfonates.

Such a compound can be added in an amount ranging from 1 to 20% by weight, and preferably from 3 to 10% by weight of the solids content of the thermosensitive layer. When the addition amount of the compound falls within this range, the developability is not hindered, and a good reaction initiation or promotion effect is obtained.

A hydrophilic resin may be added to the thermosensitive layer of the invention. The addition of the hydrophilic resin brings not only good developability but also enhancement of the film strength of the thermosensitive layer itself.

Examples of the hydrophilic resin include those having a hydrophilic group such as hydroxyl, carboxyl, hydroxyethyl, hydroxypropyl, amino, aminoethyl, aminopropyl, and carboxymethyl.

Specific examples of the hydrophilic resin include gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, a homopolymer or copolymers of hydroxyethyl methacrylate, a homopolymer or copolymers of hydroxyethyl acrylate, a homopolymer or copolymers of hydroxypropyl methacrylate, a homopolymer or copolymers of hydroxypropyl acrylate, a homopolymer or copolymers of hydroxybutyl methacrylate, a homopolymer or copolymers of hydroxybutyl acrylate, polyethylene glycols, hydroxypropylene polymers, polyvinyl alcohols, hydrolyzed polyvinyl acetates having a degree of hydrolysis of at least 60% by weight, and preferably at least 80% by weight, polyvinyl formal, polyvinyl butyral, polyvinylpyrrolidone, a homopolymer or copolymers of acrylamide, a homopolymer or copolymers of methacrylamide, and a homopolymer or copolymers of N-methylolacrylamide.

The addition amount of the hydrophilic resin to the thermosensitive layer is preferably from 5 to 40% by weight, and more preferably from 10 to 30% by weight of the solids content of the thermosensitive layer. When the addition amount of the hydrophilic resin falls within this range, good developability and film strength are obtained.

In the lithographic printing plate precursor of the invention, when a light-heat converting agent is contained in the thermosensitive layer or an adjacent layer thereto (such as the hydrophilic layer, the undercoat layer, and an overcoat layer as described later), it is possible to undergo imagewise recording upon irradiation with laser, etc. Further, in the case where the light-heat converting agent may be encapsulated in the microcapsule, or may be contained outside the microcapsule. As the light-heat converting agent, any substance capable of absorbing the wavelength of a laser source is employable, and various pigments, dyes and metallic fine particles can be used. As the pigments, dyes and metallic fine particles, explanations of the light-heat converting agent used in the first aspect of the invention are applied to the light-heat converting agent used in the second aspect of the invention. Especially, light-absorbing substances having an absorption band in at least a part of the wavelength of from 700 to 1,200 nm are preferable.

In the thermosensitive layer of the lithographic printing plate precursor of the invention, a low-molecular compound having a functional group capable of reacting with the oleophilic compound to be contained in the microcapsule and its protective group can further be contained. The addition amount of such a low-molecular compound is preferably from 5% by weight to 40% by weight, and especially preferably from 5% by weight to 20% by weight in the thermosensitive layer. When the addition amount of the low-molecular compound is lower than the above-specified range, the crosslinking effect is low so that the resistance to printing is not satisfactory. On the other hand, when it exceeds this range, the developability after elapse is worse. As specific examples of such compounds, can be enumerated those enumerated above as the specific examples of the oleophilic compound to be encapsulated in the microcapsule.

Further, various compounds other than those described above may be added in the thermosensitive layer of the invention, if desired. For example, in order to make it easy to discriminate the image portions from the non-image portions after the image formation, it is possible to use a dye having large absorption in a visible light region as a coloring agent of the image. Specific examples include Oil Yellow #101, Oil Yellow #103, Oil Pink #312, Oil Green BG, Oil Blue BOS, Oil Blue #603, Oil Black BY, Oil Black BS, and Oil Black T-505 (all being manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and the dyes as described in JP-A-62-293247. Further, phthalocyanine-based pigments, azo-based pigments, and pigments such as titanium oxide can be suitably used. The addition amount of the dye is preferably from 0.01 to 10% by weight based on the total solids content of the coating solution for thermosensitive layer.

In addition, in order to make the image portions and the non-image portions clear upon exposure, it is preferred to add a color developing or color fading compound in the thermosensitive layer of the invention. Examples include thermal acid generators (such as diazo compounds and diphenyl iodonium salts), leuco dyes (such as Leuco Malachite Green, Leuco Crystal Violet, and lactones of Crystal Violet), and pH discoloring dyes (such as dyes including Ethyl Violet and Victoria Pure Blue BOH).

Further, in the invention, in order to prevent unnecessary heat polymerization of the ethylenically unsaturated compound from occurrence during the preparation or preservation of the coating solution for thermosensitive layer, it is desired to add a small amount of a heat polymerization inhibitor. Suitable examples of the heat polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2' -methylenebis (4-methyl-6-t-butylphenol), and N-nitroso-N-phenylhydroxylamine aluminum salt. The addition amount of the heat polymerization inhibitor is from about 0.01 to 5% by weight on a basis of the weight of the whole of the composition.

Moreover, if desired, in order to prevent polymerization inhibition by oxygen, a higher fatty acid such as behenic acid and behenic amide or a derivative thereof may be added such that it is locally present on the surface of the thermosensitive layer during the drying step after coating. The addition amount of the higher fatty acid or its derivative is preferably from about 0.1 to about 10% by weight of the solids content of the thermosensitive layer.

In addition, in order to impart flexibility of the coating film, etc., a plasticizer can be added to the thermosensitive layer of the invention, if desired. Examples include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The thermosensitive layer of the invention is provided by dispersing or dissolving the respective necessary components to prepare a coating solution, which is then applied. As solvents as used herein, are employable ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyl lactone, toluene, and water. However, it should not be construed that the invention is limited thereto. These solvents are used singly or in admixture. The concentration of the solid components of the coating solution is preferably from 1 to 50% by weight.

Further, the coverage (solids content) of the thermosensitive layer on the support as obtained after drying varies depending on the utilization, but is preferably from 0.4 to 5.0 $g/m^2$. When the coverage of the thermosensitive layer is less than this range, the apparent sensitivity increases, but the film characteristics of the thermosensitive layer functioning the image recording lower. As the application method, various methods can be used. Examples include bar coater coating, rotary coating, spray coating, curtain coating, dip coating, air knife coating, blade coating, and roll coating.

For the purpose of enhancing the coating properties, it is possible to add, for example, a fluorine-based surfactant as described in JP-A-62-170950 in the coating solution for thermosensitive layer. The addition amount of the fluorine-based surfactant is preferably from 0.01 to 1% by weight, and more preferably from 0.05 to 0.5% by weight of the total solids content of the thermosensitive layer.

(Overcoat Layer)

For the purpose of preventing stains or flaws of the surface of the thermosensitive layer by the oleophilic substance, the lithographic printing plate precursor of the invention can be provided with an overcoat layer on the thermosensitive layer. The overcoat layer to be used in the invention is one that can be easily removed by a hydrophilic printing liquid such as dampening water during the printing and contains a resin selected from hydrophilic organic high-molecular compounds. With respect to the hydrophilic organic high-molecular compounds as used herein, coating films obtained upon drying have a film forming ability. Specific examples include polyvinyl alcohols (those having a degree of hydrolysis of 65% or more), polyacrylamine salts, polyacrylic acid copolymers and alkali metal salts or amine salts thereof, polymethacrylic acid and alkali metal salts or amine salts thereof, polymethacrylic acid copolymers and alkali metal salts or amine salts thereof, polyacrylamide and copolymers thereof, polyhydroxyethyl acrylate, polyvinylpyrrolidone and copolymers thereof, polyvinyl methyl ether, vinyl methyl ether/maleic anhydride copolymers, poly-2-acrylamide-2-methyl-1-propanesulfonic acid and alkali metal salts or amine salts thereof, poly-2-acrylamide-2-methyl-1-propanesulfonic acid copolymers and alkali metal salts or amine salts thereof, gum arabic, cellulose derivatives (such as carboxymethyl cellulose, carboxyethyl cellulose, and methyl cellulose) and modification products thereof, white dextrin, pullulane, and enzymatically decomposed etherified dextrin. Further, these resins may be used in admixture of two or more thereof depending on the purpose.

Further, the foregoing hydrophilic light-heat converting agent may be added to the overcoat layer. In addition, for the purpose of ensuring the uniformity of the coating, in the case of applying the aqueous solution, a nonionic surfactant such as polyoxyethylene nonylphenyl ether and polyoxyethylene dodecyl ether can be added in the overcoat layer.

The coverage (after drying) of the overcoat layer is preferably from 0.1 to 2.0 $g/m^2$. When the coverage of the overcoat layer falls within this range, it is possible to prevent stains or flaws of the surface of the thermosensitive layer by the oleophilic substance, such as finger print adhesion, without deterioration of the developability.

(Image Formation and Plate Making)

The image is formed on the lithographic printing plate precursor of the invention by heat. Specifically, though direct imagewise recording by a thermo-recording head, etc., scanning exposure by infrared laser, high-illumination flash exposure by a xenon discharge lamp, etc., and infrared lamp exposure may be employed, exposure by solid high-output infrared lasers emitting infrared rays having a wavelength of from 700 to 1,200 nm, such as semiconductor laser and YAG laser is suitable.

In the image-recorded lithographic printing plate precursor of the invention, the printing plate is then rubbed by a rubbing member in the presence of a processing liquid to remove the thermosensitive layer of non-image portions (in the case where the overcoat layer is provided, the overcoat layer is removed at the same time), and in the non-image portions, the hydrophilic support surface is exposed, to prepare a lithographic printing plate.

Examples of the rubbing member that can be used in the invention include non-woven fabrics, woven fabrics, cotton packings, moulton, rubber blades, and brushes.

As the processing liquid that is used in the invention, a hydrophilic processing liquid is suitable. Examples include water alone and aqueous solutions containing water as the major component. Especially, aqueous solution having the same composition as the generally known dampening water and aqueous solutions containing a surfactant (such as anionic, nonionic and cationic surfactants) are preferred.

The processing liquid of the invention may contain an organic solvent. Examples of the solvent that can be contained include aliphatic hydrocarbons (such as hexane, heptane, and "Isopar E, H or G" (manufactured by Shell Chemicals Ltd.), aromatic hydrocarbons (such as toluene and xylene), halogenated hydrocarbons (such as trichlene), and polar solvents as enumerated below.

Examples of the polar solvents include alcohols (such as methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, and tetraethylene glycol), ketones (such as acetone and methyl ethyl ketone), esters (such as ethyl acetate, methyl lactate, butyl lactate, propylene glycol monomethyl ether acetate, diethylene glycol acetate, and diethyl phthalate), and others (such as triethyl phosphate and tricresyl phosphate).

Further, in the case where the foregoing organic solvent is insoluble in water, it is possible to make it soluble in water using a surfactant, etc. In the case where the processing liquid contains a solvent, the concentration of the solvent is preferably less than 40% by weight from the viewpoints of safety and inflammability.

As the surfactant that is used in the processing liquid of the invention, nonionic surfactants are suitably used from the viewpoint of foaming inhibition.

Examples of the nonionic surfactants that can be used in the processing liquid of the invention include polyethylene glycol type higher alcohol ethylene oxide adducts, alkylphenol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of oils and fats, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol or sorbitan, fatty acid esters of saccharose, alkyl ethers of polyhydric alcohol, and fatty acid amides of alkanolamine. These nonionic surfactants may be used singly or in admixture of two or more thereof. In the invention, ethylene oxide adducts of sorbitol and/or sorbitan fatty acid ester, polypropylene glycol ethylene oxide adducts, dimethylsiloxane-ethylene oxide block copolymers, dimethylsiloxane-(propylene oxide-ethylene oxide) block copolymers, and fatty acid esters of polyhydric alcohol are more preferred.

Further, from the viewpoints of stable solubility and turbidity to water, the nonionic surfactant to be used in the processing liquid of the invention preferably has an HLB (hydrophile-lipophile balance) of 6 or more, and more preferably 8 or more.

In addition, the ratio of the nonionic surfactant contained in the processing liquid is preferably from 0.01 to 10% by weight, and more preferably from 0.01 to 5% by weight.

Further, alkaline agents (such as sodium carbonate, triethanolamine, diethanolamine, sodium hydroxide, and silicic acid salts) or acidic agents (such as phosphoric acid, phosphorous acid, metaphosphoric acid, pyrophosphoric acid, oxalic acid, malic acid, tartaric acid, boric acid, and amino acids), and antiseptics (such as benzoic acid and derivatives thereof, sodium dehydroacetate, 3-isothiazolone compound, 2-bromo-2-nitro-1,3-propanediol, and 2-pyridine-thiol-1-oxide sodium salt) may be added to the processing liquid.

The temperature of the processing liquid is arbitrary, but is preferably from 10° C. to 50° C.

In the invention, the removal of the thermosensitive layer of non-image portions can be suitably carried out by an automatic processor provided with supply means of processing liquid and a rubbing member. Examples of the automatic processor include the automatic processors as described in JP-A-2-220061 and JP-A-60-59351, in which the rubbing processing is carried out while conveying the lithographic printing plate precursor after the imagewise recording; and the automatic processors as described in U.S. Pat. Nos. 5,148,746 and 5,568,768 and British Patent No. 2,297,719, in which the rubbing processing of the lithographic printing plate precursor after the imagewise recording as set on a cylinder is carried out while rotating the cylinder. Among them is especially preferable an automatic processor using a rotary brush roll as the rubbing member. FIG. 1 shows one example of the automatic processor suitable for the development processing of the invention, in which a processing liquid 10 is sent to a spray pipe 5 by a circulating pump 11 and supplied to a rotary brush roll 1 and a printing plate 12 (lithographic printing plate precursor) while showering, thereby rubbing the printing plate 12 by the rotary brush roll 1. Incidentally, in the invention, it is possible to arbitrarily subsequently water-wash and dry the lithographic printing plate after the rubbing processing.

The rotary brush roll can be properly selected taking into consideration difficulty in flawing of the image portions and nerve of the support of the lithographic printing plate precursor.

As the rotary brush roll, can be employed known ones in which a brush material is formed by planting on a plastic or metallic roll. Examples include those described in JP-A-58-159533 and JP-A-3-100554 and the brush roll as described in JP-UM-B-62-167253, in which a groove type material having brush materials planted thereon in series is closely wound in a radial form around a plastic or metallic roll.

Examples of the brush material that can be used include plastic fibers (such as polyester-based synthetic fibers such as polyethylene terephthalate and polybutylene terephthalate; polyamide-based synthetic fibers such as nylon 6,6 and nylon 6,10; polyacrylic-based synthetic fibers such as polyacrylonitrile and polyalkyl (meth)acrylates; and polyolefin-based synthetic fibers such as polypropylene and polystyrene). The hairs of the fiber suitably have a diameter of from 20 to 400 μm and a length of from 5 to 30 mm.

In addition, an outer diameter of the rotary brush roll is preferably from 30 to 200 mm, and a peripheral speed of the tip of the rush to rub the printing plate is preferably from 0.1 to 5 m/sec.

The rotation direction of the rotary brush roll to be used in the invention may be the same direction as or a reverse direction to the conveyance direction of the lithographic printing plate precursor of the invention. However, in the case where two or more rotary brush rolls are used as in the automatic processor of FIG. 1, it is preferred that at least one rotary brush roll rotates in the same direction, whereas at least one rotary brush roll rotates in a reverse direction. Thus, the removal of the thermosensitive layer of non-image portions will become surer. In addition, it is effective to rock the rotary brush roll in the rotary axis direction of the brush roll.

EXAMPLES

The invention will be hereunder described in more detail with reference to the following Examples, but it should not be construed that the invention is limited thereto.

Example 1

(Preparation of Aluminum Support)

The surface of a 0.24 mm-thick rolled sheet made of a JIS A1050 aluminum material (heat conductivity: 0.48 cal/cm·sec·° C.) containing 0.01% by weight of copper, 0.03% by weight of titanium, 0.3% by weight of iron, and 0.1% by weight of silicon in 99.5% by weight of aluminum was sandblasted using a 20% by weight aqueous suspension of 400-mesh pumice stone (manufactured by KMC Corporation) and a rotary nylon brush (made of 6,10-nylon) and then well rinsed with water. The resulting aluminum sheet was dipped in and etched with a 15% by weight sodium hydroxide aqueous solution (containing 4.5% by weight of aluminum) such that the dissolution amount of aluminum was 5 g/m$^2$, and then rinsed with running water. Additionally, the resulting aluminum sheet was neutralized with 1% by weight nitric acid and then subjected to electrolytic roughing processing in a 0.7% by weight nitric acid aqueous solution (containing 0.5% by weight of aluminum) using a rectangular alternating voltage (having a current ratio r of 0.90, and the current waveform as described in JP-B-58-5796) having a voltage at anodization of 10.5 volts and a voltage at cathodization of 9.3 volts at an electrical quantity at anodization of 160 coulombs/dm$^2$. After rinsing with water, the resulting aluminum sheet was dipped in and etched with a 10% by weight sodium hydroxide aqueous solution at 35° C. such that the dissolution amount of aluminum was 1 g/m$^2$, and then rinsed with water. Subsequently, the aluminum sheet was dipped in and desmutted with a 30% by weight sulfuric acid aqueous solution at 50° C., and then rinsed with water.

Further, the aluminum sheet was subjected to porous anodic oxidation film formation processing in a 20% by weight sulfuric acid aqueous solution (containing 0.8% by weight of aluminum) at 35° C. using a direct current. Namely, the aluminum sheet was electrolyzed at a current density of 13 A/dm$^2$, and the electrolysis time was regulated such that the weight of the anodically oxidized film was 2.7 g/m$^2$.

This support was rinsed with water, dipped in a 0.2% by weight sodium silicate aqueous solution at 70° C. for 30 seconds, rinsed with water, and then dried.

(Synthesis of Finely Granular Polymer 1)

2.0 g of glycidyl methacrylate, 13.0 g of methyl methacrylate, and 200 mL of a polyoxyethylene phenol aqueous solution (concentration: 9.8×10$^{-3}$ mol/L) were added, and the system was purged with a nitrogen gas while stirring at 250 rpm. This solution was adjusted at a temperature of 25° C., to which was then added 10 mL of a cerium(IV) ammonium salt aqueous solution (concentration: 0.984×10$^{-3}$ mol/L). During this time, an ammonium nitrate aqueous solution (concentration: 58.8×10$^{-3}$ mol/L) was added to adjust the pH at 1.3 to 1.4. Thereafter, the mixture was stirred for 8 hours. The thus obtained solution had a solids content of 9.5% and a mean particle size of 0.4 μm.

(Formation of Thermosensitive Layer)

On the foregoing support, a coating solution having the following composition was applied and then dried (at 90° C. for 2 minutes) to form a thermosensitive layer having a coverage (after drying) of 1 g/m$^2$. There was thus obtained a lithographic printing plate precursor.

| (Coating solution 1 for thermosensitive layer) | |
|---|---|
| Dispersion of finely granular polymer 1 as synthesized above: | 52.6 g |
| Polyhydxoxyethyl acrylate (weight average molecular weight: 25,000): | 0.5 g |
| Light-heat. converting agent A (described below): | 0.3 g |
| Water: | 100 g |

(Light-heat converting agent A)

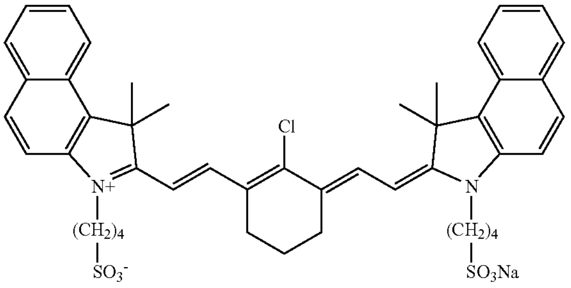

(Preparation of Lithographic Printing Plate)

The thus obtained lithographic printing plate precursor was exposed using Trendsetter 3244VFS (manufactured by Creo Inc.) mounted with a water cooling type 40-W infrared ray semiconductor laser at a printing plate energy of 200 mJ/cm$^2$ and a resolution of 2400 dpi, and then developed using an automatic processor equipped with two brush rolls, having the same mechanism as in FIG. 1. One of the two rotary brush rolls was a brush roll having polybutylene terephthalate-made fibers (hair diameter: 200 μm, hair length: 17 mm) planted thereon and having an outer diameter of 90 mm, which was rotated in the same direction as the conveyance direction at 200 rpm (spherical speed of tip of brush: 0.94 m/sec), and the other was a brush roll having polybutylene terephthalate-made fibers (hair diameter: 200 μm, hair length: 17 mm) planted thereon and an outer diameter of 60 mm, which was rotated in an opposite direction to the conveyance direction at 200 rpm (spherical speed of tip of brush: 0.63 m/sec). The conveyance of the lithographic printing plate precursor was carried out at a conveyance speed of 100 cm/min.

The following processing liquid 1 was used as the processing liquid and supplied to the printing plate from the spray pipe by the circulating pump while showering.

| (Processing liquid 1) | |
|---|---|
| Rheodol TW-0106 (polyoxyethylene sorbitan monooleate, HLB = 10.0, manufactured by Kao corporation): | 0.5 g |
| EU-3 (etching solution, manufactured by Fuji Photo Film Co., Ltd.): | 2.0 g |
| Water: | 97.5 g |

(Evaluation of Printing)

Next, the thus obtained lithographic printing plate was installed on a cylinder of a Heidelberg's printing machine SOR-M and printed (dampening water as used: an aqueous solution having 4% by volume of IF-102 (manufactured by Fuji Photo Film Co., Ltd.), ink as used: TK HIGH-ECO-SOYMZ SUMI (manufactured by Toyo Ink Mfg., Co. Ltd.)). As a result, the ink of non-image portions at the time of printing-out was swept away within 10 copies, and stains of the non-image portions disappeared. There were thus obtained prints with good ink adhesion of image portions.

Comparative Example 1

The lithographic printing plate precursor of Example 1 was imagewise exposed in the same manner as in Example 1 and subjected to development processing in the same manner as in Example 1, except that the rotary brush roll of the automatic processor was detached. That is, only the rinsing with the processing liquid was carried out without rubbing by the rubbing member. Thereafter, the obtained lithographic printing plate was installed on a cylinder of a Heidelberg's printing machine SOR-M and printed in the same manner as in Example 1. As a result, 50 copies were needed until the ink of non-image portions at the time of printing-out was swept away, and stains of the non-image portions disappeared.

Comparative Example 2

The lithographic printing plate precursor of Example 1 was imagewise exposed in the same manner as in Example 1, installed on a cylinder of a Heidelberg's printing machine SOR-M without subjecting to any processing, and then printed in the same manner as in Example 1. As a result, 50 copies were needed until the ink of non-image portions at the time of printing-out was swept away, and stains of the non-image portions disappeared.

Example 2

(Synthesis of Finely Granular Polymer 2)

7.5 g of allyl methacrylate and 7.5 g of styrene were polymerized in the same manner as in the synthesis of the finely granular polymer 1 as above. The thus obtained solution had a solids content of 9.5% and a mean particle size of 0.4 μm.

(Formation of Thermosensitive Layer)

A lithographic printing plate precursor was obtained by forming a thermosensitive layer in the same manner as in Example 1, except that the coating solution for thermosensitive layer of Example 1 was replaced by a coating solution having the following composition.

| (Coating solution 2 for thermosensitive layer) | |
|---|---|
| Dispersion of finely granular polymer 2 as synthesized above: | 52.6 g |
| Polyacrylic acid (weight average molecular weight: 25,000): | 0.5 g |
| Sorbitol triacrylate: | 1.0 g |
| Light-heat converting agent A: | 0.3 g |
| Water: | 100 g |

Next, the obtained lithographic printing plate precursor was imagewise exposed, subjected to development processing, and then printed in the same manner as in Example 1. As a result, the ink of non-image portions at the time of printing-out was swept away within 10 copies, and stains of the non-image portions disappeared. There were thus obtained prints with good ink adhesion of image portions.

Example 3

(Synthesis of Finely Granular Polymer 3)

15 g of styrene was polymerized in the same manner as in the synthesis of in the same manner as in the synthesis of the finely granular polymer 1 as above. The thus obtained solution had a solids content of 9.0% and a mean particle size of 0.3 μm.

(Formation of Thermosensitive Layer)

A lithographic printing plate precursor was obtained by forming a thermosensitive layer in the same manner as in Example 1, except that the coating solution for thermosensitive layer of Example 1 was replaced by a coating solution having the following composition.

| (Coating solution 3 for thermosensitive layer) | |
|---|---|
| Dispersion of finely granular polymer 3 as synthesized above: | 52.6 g |
| Polyacrylic acid (weight average molecular weight: 25,000): | 0.5 g |
| Light-heat converting agent A: | 0.3 g |
| Water: | 100 g |

Next, the obtained lithographic printing plate precursor was imagewise exposed, subjected to development processing, and then printed in the same manner as in Example 1. As a result, the ink of non-image portions at the time of printing-out was swept away within 10 copies, and stains of the non-image portions disappeared. There were thus obtained prints with good ink adhesion of image portions.

Example 4

A lithographic printing plate precursor was obtained in the same manner as in Example 1, except that the following overcoat layer was formed on the thermosensitive layer.

(Formation of Overcoat Layer)

On the thermosensitive layer, the following coating solution for overcoat layer was applied and dried upon heating (at 100° C. for 2 minutes) to form an overcoat layer at a coverage (after drying) of 0.3 g/$m^2$.

| (Coating solution for overcoat layer) | |
|---|---|
| Gum arabic: | 1 g |
| Emalex 710 (polyoxyethylene lauryl ether, manufactured by Nihon-Emulsion Co., Ltd.): | 0.025 g |
| Water: | 19 g |

Next, the obtained lithographic printing plate precursor was imagewise exposed, subjected to development processing, and then printed in the same manner as in Example 1. As a result, the ink of non-image portions at the time of printing-out was swept away within 10 copies, and stains of the non-image portions disappeared. There were thus obtained prints with good ink adhesion of image portions.

Example 2-1

(Preparation of Aluminum Support)

The surface of a 0.24 mm-thick rolled sheet made of a JIS A1050 aluminum material (heat conductivity: 0.48 cal/cm·sec·° C.) containing 0.01% by weight of copper, 0.03% by weight of titanium, 0.3% by weight of iron, and 0.1% by weight of silicon in 99.5% by weight of aluminum was sandblasted using a 20% by weight aqueous suspension of 400-mesh pumice stone (manufactured by KMC Corporation) and a rotary nylon brush (made of 6,10-nylon) and then well rinsed with water. The resulting aluminum sheet was dipped in and etched with a 15% by weight sodium hydroxide aqueous solution (containing 4.5% by weight of aluminum) such that the dissolution amount of aluminum was 5 g/$m^2$, and then rinsed with running water. Additionally, the resulting aluminum sheet was neutralized with 1% by weight nitric acid and then subjected to electrolytic roughing processing in a 0.7% by weight nitric acid aqueous solution (containing 0.5% by weight of aluminum) using a rectangular alternating voltage (having a current ratio r of 0.90, and the current waveform as described in JP-B-58-5796) having a voltage at anodization of 10.5 volts and a voltage at cathodization of 9.3 volts at an electrical quantity at anodization of 160 coulombs/$dm^2$. After rinsing with water, the resulting aluminum sheet was dipped in and etched with a 10% by weight sodium hydroxide aqueous solution at 35° C. such that the dissolution amount of aluminum was 1 g/$m^2$, and then rinsed with water. Subsequently, the aluminum sheet was dipped in and desmutted with a 30% by weight sulfuric acid aqueous solution at 50° C., and then rinsed with water.

Further, the aluminum sheet was subjected to porous anodic oxidation film formation processing in a 20% by weight sulfuric acid aqueous solution (containing 0.8% by weight of aluminum) at 35° C. using a direct current. Namely, the aluminum sheet was electrolyzed at a current density of 13 A/$dm^2$, and the electrolysis time was regulated such that the weight of the anodically oxidized film was 2.7 g/$m^2$.

This support was rinsed with water, dipped in a 0.2% by weight sodium silicate aqueous solution at 70° C. for 30 seconds, rinsed with water, and then dried.

(Synthesis of Microcapsule 2-1 Encapsulating Oleophilic Compound therein)

In 60 g of ethyl acetate were dissolved 30 g of Takenate D-110N (trifunctional isocyanate, manufactured by Takeda Chemical Industries, Ltd.), 10 g of Karenz MOI (2-methacryloyloxyethyl isocyanate, manufactured by Showa Denko K.K.), 10 g of trimethylolpropane triacrylate, 10 g of a copolymer of allyl methacrylate and butyl methacrylate (molar ratio: 60/40), and 0.1 g of Pionin A41C (manufactured by Takemoto Oil & Fat Co., Ltd.) as oil phase components. 120 g of a 4% aqueous solution of PVA 205 (manufactured by Kuraray Co., Ltd.) was prepared as a water phase component. The oil phase components and the water phase component were emulsified at 10,000 rpm using a homogenizer. Thereafter, 40 g of water was added to the emulsion, and the mixture was stirred at room temperature for 30 minutes and then at 40° C. for 3 hours. The thus obtained microcapsule solution had a solids content of 20% and a mean particle size of 0.5 μm.

(Formation of Thermosensitive Layer)

On the foregoing support, a coating solution having the following composition was applied and then dried (at 90° C. for 2 minutes) to form a thermosensitive layer having a coverage (after drying) of 1 g/$m^2$. There was thus obtained a lithographic printing plate precursor.

| (Coating solution 2-1 for thermosensitive layer) | |
|---|---|
| Dispersion of microcapsule 2-1 as synthesized above: | 25 g |
| Polyacrylic acid (weight average molecular weight: 25,000): | 0.5 g |
| Sorbitol triacrylate: | 1.0 g |
| Light-heat converting agent A (described below): | 0.3 g |
| Sulfate of t-butyldiphenyl iodonium: | 0.3 g |
| Water: | 70 g |
| 1-Methoxy-2-propanol: | 30 g |

(Light-heat converting agent A)

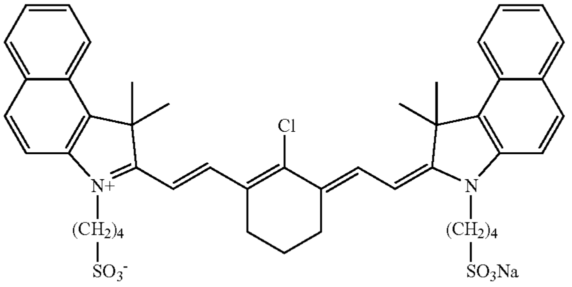

(Preparation of Lithographic Printing Plate)

The thus obtained lithographic printing plate precursor was exposed using Trendsetter 3244VFS (manufactured by Creo Inc.) mounted with a water cooling type 40-W infrared ray semiconductor laser at a printing plate energy of 200 mJ/$cm^2$ and a resolution of 2400 dpi, and then developed using an automatic processor equipped with two brush rolls, having the same mechanism as in FIG. 1. One of the two rotary brush rolls was a brush roll having polybutylene terephthalate-made fibers (hair diameter: 200 μm, hair length: 17 mm) planted thereon and having an outer diameter of 90 mm, which was rotated in the same direction as the conveyance direction at 200 rpm (spherical speed of tip of brush: 0.94 m/sec), and the other was a brush roll having polybutylene terephthalate-made fibers (hair diameter: 200 μm, hair length: 17 mm) planted thereon and an outer diameter of 60 mm, which was rotated in an opposite direction to the conveyance direction at 200 rpm (spherical speed of tip of brush: 0.63 m/sec). The conveyance of the lithographic printing plate precursor was carried out at a conveyance speed of 100 cm/min.

The following processing liquid 2-1 was used as the processing liquid and supplied to the printing plate from the spray pipe by the circulating pump while showering.

| (Processing liquid 2-1) | |
|---|---|
| Rheodol TW-0106 (polyoxyethylene sorbitan monooleate, HLB = 10.0, manufactured by Kao corporation): | 0.5 g |
| EU-3 (etching solution, manufactured by Fuji Photo Film Co., Ltd.): | 2.0 g |
| Water: | 97.5 g |

(Evaluation of Printing)

Next, the thus obtained lithographic printing plate was installed on a cylinder of a Heidelberg's printing machine SOR-M and printed (dampening water as used: an aqueous solution having 4% by volume of IF-102 (manufactured by Fuji Photo Film Co., Ltd.), ink as used: TK HIGH-ECO-SOYMZ SUMI (manufactured by Toyo Ink Mfg., Co., Ltd.)). As a result, the ink of non-image portions at the time of printing-out was swept away within 10 copies, and stains of the non-image portions disappeared. There were thus obtained prints with good ink adhesion of image portions.

Comparative Example 2-1

The lithographic printing plate precursor of Example 2-1 was imagewise exposed in the same manner as in Example 2-1 and subjected to development processing in the same manner as in Example 2-1, except that the rotary brush roll of the automatic processor was detached. That is, only the rinsing with the processing liquid was carried out without rubbing by the rubbing member. Thereafter, the obtained lithographic printing plate was installed on a cylinder of a Heidelberg's printing machine SOR-M and printed in the same manner as in Example 2-1. As a result, 50 copies were needed until the ink of non-image portions at the time of printing-out was swept away, and stains of the non-image portions disappeared.

Comparative Example 2-2

The lithographic printing plate precursor of Example 2-1 was imagewise exposed in the same manner as in Example 2-1, installed on a cylinder of a Heidelberg's printing machine SOR-M without subjecting to any processing, and then printed in the same manner as in Example 2-1. As a result, 50 copies were needed until the ink of non-image portions at the time of printing-out was swept away, and stains of the non-image portions disappeared.

Example 2-2

(Synthesis of Microcapsule 2-2 Encapsulating Oleophilic Compound therein)

In 60 g of ethyl acetate were dissolved 40 g of Takenate D-110N (trifunctional isocyanate, manufactured by Takeda Chemical Industries, Ltd.), 20 g of diethylene glycol diglycidyl ether, and 0.1 g of Pionin A41C (manufactured by Takemoto Oil & Fat Co., Ltd.) as oil phase components. 120 g of a 4% aqueous solution of PVA 205 (manufactured by Kuraray Co., Ltd.) was prepared as a water phase component. The oil phase components and the water phase component were emulsified at 10,000 rpm using a homogenizer. Thereafter, 40 g of water was added to the emulsion, and the mixture was stirred at room temperature for 30 minutes and then at 40° C. for 3 hours. The thus obtained microcapsule solution had a solids content of 20% and a mean particle size of 0.6 μm.

(Formation of Thermosensitive Layer)

A lithographic printing plate precursor was obtained by forming a thermosensitive layer in the same manner as in Example 2-1, except that the coating solution for thermosensitive layer of Example 2-1 was replaced by a coating solution having the following composition.

| (Coating solution 2-2 for thermosensitive layer) | |
|---|---|
| Dispersion of microcapsule 2-2 as synthesized above: | 25 g |
| Polyacrylic acid (weight average molecular weight: 25,000): | 0.5 g |
| Diethylenetriamine: | 1.0 g |
| Light-heat converting agent A: | 0.3 g |
| Sulfate of t-butyldiphenyl iodonium: | 0.3 g |
| Water: | 70 g |
| 1-Methoxy-2 -propanol: | 30 g |

Next, the obtained lithographic printing plate precursor was imagewise exposed, subjected to development processing, and then printed in the same manner as in Example 2-1. As a result, the ink of non-image portions at the time of printing-out was swept away within 10 copies, and stains of the non-image portions disappeared. There were thus obtained prints with good ink adhesion of image portions.

Example 2-3

(Synthesis of Microcapsule 2-3 Encapsulating Oleophilic Compound therein)

In 60 g of ethyl acetate were dissolved 40 g of Takenate D-110N (trifunctional isocyanate, manufactured by Takeda Chemical Industries, Ltd.), 15 g of bis(vinyloxyethyl) ether of bisphenol A, 5 g of a light-heat converting agent B (as described below), and 0.1 g of Pionin A41C (manufactured by Takemoto Oil & Fat Co., Ltd.) as oil phase components. 120 g of a 4% aqueous solution of PVA 205 (manufactured by Kuraray Co., Ltd.) having 1 g of tetraethylenepentamine dissolved therein was prepared as a water phase component. The oil phase components and the water phase component were emulsified at 10,000 rpm using a homogenizer. Thereafter, 40 g of water was added to the emulsion, and the mixture was stirred at room temperature for 30 minutes and then at 40° C. for 3 hours. The thus obtained microcapsule solution had a solids content of 20% and a mean particle size of 0.4 μm.

(Light-heat converting agent B)

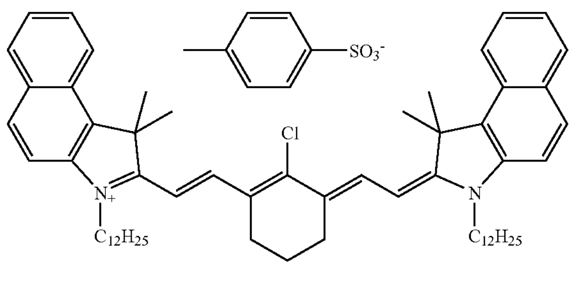

(Formation of Thermosensitive Layer)

A lithographic printing plate precursor was obtained by forming a thermosensitive layer in the same manner as in Example 2-1, except that the coating solution for thermosensitive layer of Example 2-1 was replaced by a coating solution having the following composition.

| (Coating solution 2-3 for thermosensitive layer) | |
|---|---|
| Dispersion of microcapsule 2-3 as synthesized above: | 25 g |
| Trifluoromethyl sulfonate of diphenyl iodonium: | 0.5 g |
| Megafac F-171 (fluorine-based surfactant, manufactured by Dainippon Ink and Chemicals, Incorporated:) | 0.05 g |
| Water: | 100 g |

Next, the obtained lithographic printing plate precursor was imagewise exposed, subjected to development processing, and then printed in the same manner as in Example 2-1. As a result, the ink of non-image portions at the time of printing-out was swept away within 10 copies, and stains of the non-image portions disappeared. There were thus obtained prints with good ink adhesion of image portions.

Example 2-4

A lithographic printing plate precursor was obtained in the same manner as in Example 2-1, except that the following overcoat layer was formed on the thermosensitive layer.

(Formation of Overcoat Layer)

On the thermosensitive layer, the following coating solution for overcoat layer was applied and dried upon heating (at 100° C. for 2 minutes) to form an overcoat layer at a coverage (after drying) of 0.3 $g/m^2$.

| (Coating solution for overcoat layer) | |
|---|---|
| Gum arabic: | 1 g |
| Emalex 710 (polyoxyethylene lauryl ether, manufactured by Nihon-Emulsion Co., Ltd.): | 0.025 g |
| Water: | 19 g |

Next, the obtained lithographic printing plate precursor was imagewise exposed, subjected to development processing, and then printed in the same manner as in Example 2-1. As a result, the ink of non-image portions at the time of printing-out was swept away within 10 copies, and stains of the non-image portions disappeared. There were thus obtained prints with good ink adhesion of image portions.

According to the invention, it is possible to efficiently and surely remove a thermosensitive layer of non-image portions of a lithographic printing plate precursor capable of undergoing heat mode recording by a simple development processing method, and especially to prevent stains at the time of printing out.

This application is based on Japanese Patent application JP 2002-122295, filed Apr. 24, 2002, and Japanese Patent application JP 2002-122654, filed Apr. 24, 2002, the entire contents of those are hereby incorporated by reference, the same as if set forth at length.

What is claimed is:

1. A method for preparation of a lithographic printing plate, which comprises the steps of:

imagewise recording on a lithographic negative thermosensitive printing plate precursor comprising a support having a hydrophilic surface and a thermosensitive layer, the thermosensitive layer comprising at least one of polymer particles and microcapsules encapsulating an oleophilic compound therein, where the polymer particles and the microcapsules each have a hydrophilic surface and are dispersible in water;

showering the lithographic negative thermosensitive printing plate precursor with processing liquid; and rubbing the printing plate precursor with a rubbing member in the presence of a processing liquid with an automatic processor provided with the rubbing member to remove the thermosensitive layer of non-image portions;

wherein the thermosensitive layer contains the at least one of polymer particles and microcapsules in an amount of 50% by weight or more of the solids content of the thermosensitive layer.

2. The method according to claim 1, wherein the lithographic printing plate precursor further comprises an overcoat layer capable of being removed with the processing liquid.

3. The method according to claim 2, wherein the overcoat layer comprises a light-heat converting agent.

4. The method according to claim 1, wherein the polymer particles and the oleophilic compound each comprises a thermo-reactive functional group.

5. The method according to claim 4, wherein the thermo-reactive functional group is at least one of an acryloyl group, a methacryloyl group, a vinyl group, an allyl group, an epoxy group, an amino group, a hydroxyl group, a carboxyl group, an isocyanate group and an acid anhydride, and a protective group thereof.

6. The method according to claim 1, wherein the polymer particles and the microcapsules each have a mean particle size of from 0.01 to 20 μm.

7. The method according to claim 1, wherein the thermosensitive layer further comprises a light-heat converting agent.

8. The method according to claim 1, wherein the processing liquid is hydrophilic aqueous solution containing a surfactant.

9. The method according to claim 8, wherein the surfactant is a nonionic surfactant.

10. The method according to claim 9, wherein the nonionic surfactant has a hydrophile-lipophile balance of 6 or more.

11. The method according to claim 9, wherein the amount of the nonionic surfactant contained in the processing liquid is from 0.01 to 10% by weight.

12. The method according to claim 1, wherein the automatic processor is provided with two or more rubbing members.

13. The method according to claim 1, wherein the rubbing member is a brush.

14. The method according to claim 13, wherein the brush hairs contain at least one material selected from the group consisting of polyethylene terephthalate, polybutylene terephthalate, nylon 6.6, nylon 6.10, polyacrylonitrile and polyalkyl (meth)acrylates, polypropylene and polystyrene.

15. The method according to claim 13, wherein hairs of the brush have a diameter of from 20 to 400 μm.

16. The method according to claim 13, wherein hairs of the brush have a length of from 5 to 30 mm.

17. The method according to claim 13, wherein the rubbing member is a rotary brush roll.

18. The method according to claim 17, wherein the rotary brush roll has an outer diameter of from 30 to 200 mm.

19. The method according to claim 17, wherein the rotary brush roll has a peripheral speed of a tip of the brush for rubbing the printing plate of from 0.1 to 5 m/sec.

20. The method according to claim 1, wherein the thermosensitive layer comprises a hydrophilic resin in an amount of 5 to 40% by weight of the solids content of the thermosensitive layer.

21. A method for preparation of a lithographic printing plate, which comprises the steps of:

imagewise recording on a lithographic negative thermosensitive printing plate precursor comprising a support having a hydrophilic surface and a thermosensitive layer, the thermosensitive layer comprising microcapsules encapsulating an oleophilic compound therein;

showering the lithographic negative thermosensitive printing plate precursor with processing liquid; and rubbing the printing plate precursor with a rubbing member in the presence of a processing liquid with an automatic processor to remove the thermosensitive layer of non-image portions;

wherein the thermosensitive layer contains the microcapsules in an amount of 50% by weight or more of the solids content of the thermosensitive layer.

22. The method according to claim 21, wherein the oleophilic compound encapsulated in the microcapsules has a thermo-reactive functional group.

23. The method according to claim 21, wherein the thermosensitive layer comprises a hydrophilic resin in an amount of 5 to 40% by weight of the solids content of the thermosensitive layer.

* * * * *